United States Patent
Kuboi

(10) Patent No.: US 9,609,228 B2
(45) Date of Patent: Mar. 28, 2017

(54) SOLID-STATE IMAGE PICKUP DEVICE WITH TRANSMITTANCE CONTROL ELEMENT

(71) Applicant: Sony Corporation, Tokyo (JP)

(72) Inventor: Nobuyuki Kuboi, Kanagawa (JP)

(73) Assignee: Sony Corporation, Tokyo (JP)

(*) Notice: Subject to any disclaimer, the term of this patent is extended or adjusted under 35 U.S.C. 154(b) by 359 days.

(21) Appl. No.: 14/206,464

(22) Filed: Mar. 12, 2014

(65) Prior Publication Data
US 2014/0285627 A1   Sep. 25, 2014

(30) Foreign Application Priority Data
Mar. 19, 2013   (JP) .................. 2013-056935

(51) Int. Cl.
| H04N 5/235 | (2006.01) |
| H04N 5/369 | (2011.01) |
| H04N 5/238 | (2006.01) |
| H01L 27/146 | (2006.01) |
| H04N 5/225 | (2006.01) |
| H04N 5/232 | (2006.01) |
| H04N 5/3745 | (2011.01) |
| H04N 9/04 | (2006.01) |
| H04N 5/351 | (2011.01) |
| H04N 5/357 | (2011.01) |

(52) U.S. Cl.
CPC ....... *H04N 5/2353* (2013.01); *H01L 27/1464* (2013.01); *H01L 27/14621* (2013.01); *H01L 27/14623* (2013.01); *H01L 27/14629* (2013.01); *H04N 5/2254* (2013.01); *H04N 5/238* (2013.01); *H04N 5/23212* (2013.01); *H04N 5/351* (2013.01); *H04N 5/357* (2013.01); *H04N 5/3696* (2013.01); *H04N 5/3745* (2013.01); *H04N 9/045* (2013.01)

(58) Field of Classification Search
CPC .... H04N 5/2353; H04N 5/3696; H04N 5/238; H04N 5/3745; H04N 5/23212; H04N 5/2254; H01L 27/14629; H01L 27/14621
See application file for complete search history.

(56) References Cited

U.S. PATENT DOCUMENTS

| 2003/0071271 A1* | 4/2003 | Suzuki | H01L 27/14601 257/98 |
| 2009/0251556 A1* | 10/2009 | Mabuchi | H01L 27/14621 348/222.1 |
| 2009/0251582 A1 | 10/2009 | Oike | |

FOREIGN PATENT DOCUMENTS

| JP | 2009-268083 A | 11/2009 |
| JP | 2012-37777 A | 2/2012 |

* cited by examiner

Primary Examiner — Christopher K Peterson
(74) Attorney, Agent, or Firm — Chip Law Group

(57) ABSTRACT

Provided is a solid-state image pickup device that includes: a plurality of pixels each including a photoelectric conversion element; and a transmittance control element provided on a light incident side of the photoelectric conversion element of at least a part of the plurality of pixels, and configured to change a transmittance of incident light by an external input.

15 Claims, 34 Drawing Sheets

SOLID-STATE IMAGE PICKUP DEVICE WITH TRANSMITTANCE CONTROL ELEMENT

CROSS REFERENCE TO RELATED APPLICATIONS

This application claims the benefit of Japanese Priority Patent Application JP 2013-056935 filed on Mar. 19, 2013, the entire contents of which are incorporated herein by reference.

BACKGROUND

The present disclosure relates to a solid-state image pickup device that includes photoelectric conversion elements as pixels, to a driving method thereof, and to an electronic apparatus.

An example of a solid-state image pickup device to be loaded on a digital video electronic apparatus, a digital still electronic apparatus, a mobile phone, a smartphone and so forth may include a CMOS (Complementary Metal Oxide Semiconductor) image sensor. In the CMOS image sensor, a photocharge stored in a p-n junction capacitor of a photodiode which is a photoelectric conversion element is read out via a MOS transistor.

As such a solid-state image pickup device as mentioned above, a device that a so-called auto-focusing function is added (for example, Japanese Unexamined Patent Application Publication No. 2012-37777, a device that a so-called global shutter function is added (for example, Japanese Unexamined Patent Application Publication No. 2009-268083) and so forth are proposed.

SUMMARY

It is desired to implement a solid-state image pickup device having such a pixel structure that implementation of various additional functions as mentioned above is possible and/or a driving method for such a solid-state image pickup device.

It is desirable to provide a solid-state image pickup device that makes it possible to implement an image picking-up function and other additional functions, a driving method thereof, and an electronic apparatus.

According to an embodiment of the present disclosure, there is provided a solid-state image pickup device including: a plurality of pixels each including a photoelectric conversion element; and a transmittance control element provided on a light incident side of the photoelectric conversion element of at least a part of the plurality of pixels, and configured to change a transmittance of incident light by an external input.

According to an embodiment of the present disclosure, there is provided a method of driving solid-state image pickup device including: driving a transmittance control element provided on a light incident side of a photoelectric conversion element in at least a part of a plurality of pixels each including the photoelectric conversion element, the transmittance control element being configured to change a transmittance of incident light; and reading out an output signal from the plurality of pixels while controlling the transmittance by driving the transmittance control element.

According to an embodiment of the present disclosure, there is provided an electronic apparatus provided with a solid-state image pickup device. The solid-state image pickup device includes: a plurality of pixels each including a photoelectric conversion element; and a transmittance control element provided on a light incident side of the photoelectric conversion element of at least a part of the plurality of pixels, and configured to change a transmittance of incident light by an external input.

In the solid-state image pickup device and the electronic apparatus according to the above-described embodiments of the present disclosure, the transmittance control element configured to change the transmittance of the incident light by the external output is disposed on the light incident side of each of the photoelectric conversion elements of at least a part of the pixels. Hence, it is possible to obtain an output signal while controlling factors such as an exposure period and a light receiving region of at least a part of the pixels. Thus, it is possible to perform, for example, a global shutter operation and/or a focusing operation utilizing an image surface phase difference and so forth.

In the driving method for solid-state image pickup device according to the above-described embodiment of the present disclosure, it is possible to obtain the output signal while controlling factors such as an exposure period and a light receiving region of at least a part of the pixels by reading out the output signal from each of the pixels while controlling the transmittance of the transmittance control element disposed on the light incident side of the photoelectric conversion element of at least a part of the pixels. Thus, it is possible to perform, for example, the global shutter operation and/or the focusing operation utilizing the image surface phase difference and so forth.

According to the solid-state image pickup device and the electronic apparatus in the above-described embodiments of the present disclosure, since the transmittance control element configured to change the transmittance of the incident light by the external output is disposed on the light incident side of the photoelectric conversion element of at least a part of the pixels, it is possible to implement, for example, a global shutter function and/or an auto-focusing function and so forth. Thus, it is possible to implement an image picking-up function and other additional functions.

According to the driving method for solid-state image pickup device in the above-described embodiment of the present disclosure, since the output signal is read out from each of the pixels while controlling the transmittance of the transmittance control element disposed on the light incident side of the photoelectric conversion element of at least a part of the pixels, it is possible to implement, for example, the global shutter function and/or the auto-focusing function and so forth. Thus, it is possible to implement the image picking-up function and other additional functions.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 7 is an explanatory schematic diagram illustrating one example of a pixel array according to a modification example 1.

FIG. 8 is an explanatory schematic diagram illustrating one example of a pixel array according to a modification example 2.

DETAILED DESCRIPTION

In the following, some embodiments of the present disclosure will be described in detail with reference to the accompanying drawings. It is to be noted that description will be made in the following order.
1. First Embodiment (one example of a solid-state image pickup device that implements a global shutter function)
2. Modification Example 1 (one example of a pixel arrangement when the same wavelength is to be detected by adjacent four pixels)
3. Modification Example 2 (one example of a pixel arrangement when a white (W) pixel has been used)
4. Second Embodiment (one example of a solid-state image pickup device that implements an image surface phase difference auto-focusing function)
5. Modification Examples 3-1 and 3-2 (arrangement examples of chromic mirrors when two adjacent pixels have been set to the same wavelength)
6. Modification Examples 4-1 and 4-2 (arrangement examples of chromic mirrors when four adjacent pixels have been set to the same wavelength)
7. Modification Examples 5-1 and 5-3 (arrangement examples of chromic mirrors when a W pixel has been used)
8. Third Embodiment (one example of a solid-state image pickup device that makes implementation of both of the global shutter function and the image surface phase difference auto-focusing function possible)
9. Modification Example 6-1 (one example of a correcting process that transmittance/reflectance has been taken into account)
10. Modification Example 6-2 (one example of a noise correcting process)
11. Modification Example 6-3 (one example of an intensity correcting process for expanding a dynamic range)
12. Modification Example 6-4 (one example of a correcting process that a light shielding film has been taken into account)
13. Modification Example 7 (one example of a driving operation performed to acquire parallax image for a stereoscopic vision)
14. Example of General Configuration of the Solid-State Image Pickup Device
15. Application Example (one example of electronic apparatus)

First Embodiment

Configuration (Pixel Structure)

Figure 1:
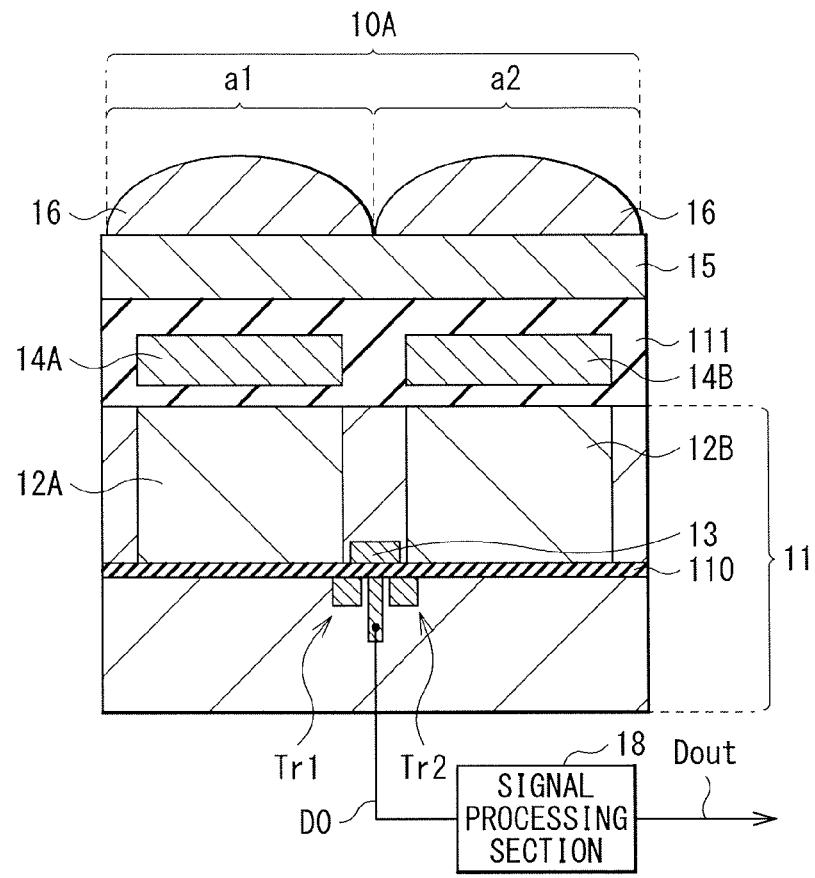
FIG. 1 is a sectional diagram illustrating one example of a configuration of main parts of a solid-state image pickup device according to a first embodiment of the present disclosure.
Figure 2:
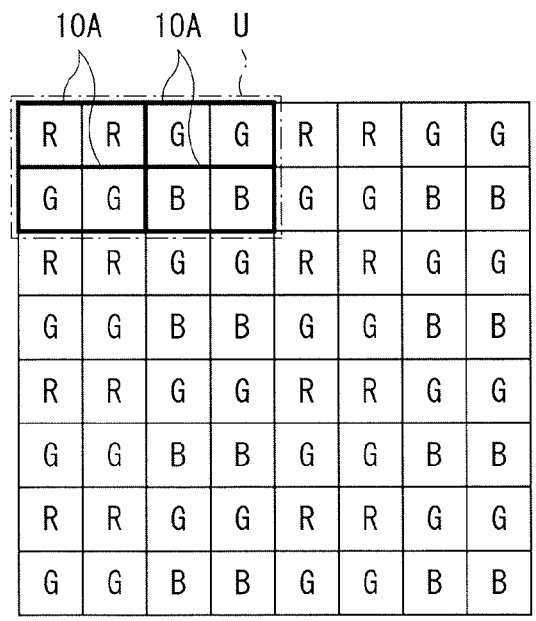
FIG. 2 is an explanatory schematic diagram illustrating one example of a pixel array of the solid-state image pickup device illustrated in FIG. 1.

FIG. 1 illustrates one example of a configuration of main parts of a solid-state image pickup device according to a first embodiment of the present disclosure. FIG. 2 illustrates one example of a pixel array (an array of colors) of the present embodiment. The solid-state image pickup device according to the present embodiment may be configured by, for example, a CCD (Charge Coupled Device) or COMS image sensor and so forth and has a configuration in which a plurality of pixels are two-dimensionally arranged in an image pickup pixel region (a later described pixel section 1*a*). In addition, although it may be any of a backside illumination type, a front-side illumination type and a longitudinal spectroscopic type, a structure of the backside illumination type one will be given by way of example here. Each pixel includes a photoelectric conversion element that may be configured by, for example, a photodiode and so forth and may detect a wavelength of any of, for example, red (R), green (G), blue (B) and so forth. In the present embodiment, two pixels a1 and a2 in the plurality of pixels are configured as one set (a pixel pair 10A) and the pixels a1 and a2 are alternately (or sequentially) driven to obtain a signal charge (an output signal D0) from the pixel pair 10A. This solid-state image pickup device includes a signal processing section 18 configured to perform predetermined signal processing on the output signal obtained from the pixel pair 10A.

Although the pixels a1 and a2 may be arranged either adjacently or separately as long as the pixels a1 and a2 configure one set of pixels that mutually detect the same wavelength, it is desirable that they be arranged adjacently. For example, each of two adjacent R pixels, G pixels, and B pixels may configures the pixel pair 10A to form a Bayer array as a whole as illustrated in FIG. 2. An array in which the pixel pairs 10A of respective colors are included at a predetermined ratio is defined as a unit array U. The size (an opening width) of each of the pixels a1 and a2 may be, for example, about 2 µm. These pixels a1 and a2 include respective photodiodes (photodiodes 12A and 12B) as photoelectric conversion elements.

The photodiodes 12A and 12B may be formed within a substrate 11 made of, for example, silicon (Si) with a thickness of, for example, about 3 µm each and have the same configuration though different numerals are assigned for convenience. Surfaces of the photodiodes 12A and 12B may have rugged forms (for example, as a periodically rugged structure, the R pixel may have a height of about 55 nm and a pitch of about 180 nm, the G pixel may have a height of about 35 nm and a pitch of about 120 nm, and the B pixel may have a height of about 25 nm and a pitch of about 90 nm). A pixel transistor that includes transfer transistors Tr1 and Tr2 and a floating diffusion (an FD 13) are formed on a front surface side of the substrate 11.

The transfer transistor Tr1 is a switching element adapted to transfer the charges stored in the photodiode 12A to the FD 13. The transfer transistor Tr2 is a switching element adapted to transfer the charges stored in the photodiode 12B to the FD13.

The FD13 may be disposed one for, for example, one pixel pair 10A, that is, is shared between the pixels a1 and a2. The FD 13 is connected to the signal processing section 18 via a wiring layer formed within the substrate 11. Since the FD 13 is shared between the pixels a1 and a2 as mentioned above, reading-out of signals from the photodiodes 12A and 12B is alternately (or sequentially) performed. In addition, since the FD 13 is shared between the pixels a1 and a2, it is possible to more reduce the influence of noise generated upon transfer than would be reduced when the FD is not shared between the pixels.

In the present embodiment, chromic mirrors (chromic mirrors 14A and 14B) are arranged on respective light incident sides of the photodiodes 12A and 12B. Here, the chromic mirror 14A (or the chromic mirror 14B) is provided pixel by pixel (for all of the pixels) and is provided so as to cover a whole region of a light receiving surface of the photodiode 12A (or the photodiode 12B). That is, in the present embodiment, the chromic mirrors 14A and 14B may be provide for all of the pixel pairs 10A, for example, within an image pickup pixel region. These chromic mirrors 14A and 14B correspond to one specific example of a "transmittance control element" in one embodiment of the present disclosure.

(Chromic Mirrors 14A and 14B)

The chromic mirrors 14A and 14B are elements that make it possible to change (adjust) the transmittance of the incident light by the external input (a driving signal input from the outside) and may be configured by elements, for example, utilizing so-called chromism (chromic elements). Examples of the chromic element may include an electrochromic element that utilizes a change in characteristic by a voltage, a thermochromic element that utilizes a change in characteristic by a temperature, a gasochromic element that utilizes gas reaction, a photochromic element that utilizes a change in characteristic by light and so forth. In the chromic mirrors 14A and 14B so configured, for example, the state of each chromic mirror may reversibly transit (may be switched) between a transmissive state (a state that the transmittance is relatively high) and a reflective state (a state that the transmittance is relatively low) via an attenuation state (a semi-transmissive state) by the external input. Thus, in the present embodiment, it is possible to control exposure times of, for example, the photodiodes 12A and 12B and it is also possible to make the photodiodes 12A and 12B temporarily function as memory regions. These chromic mirrors 14A and 14B may be embedded in, for example, an insulating layer 111 that is formed on a rear surface (a surface on a light receiving side) of the substrate 11. The insulating layer 111 may be made of, for example, a silicon oxide (such as $SiO_2$) and/or a silicon nitride (such as SiN) and so forth. A color filter layer 15 is formed on the insulating layer 111.

Figure 3:
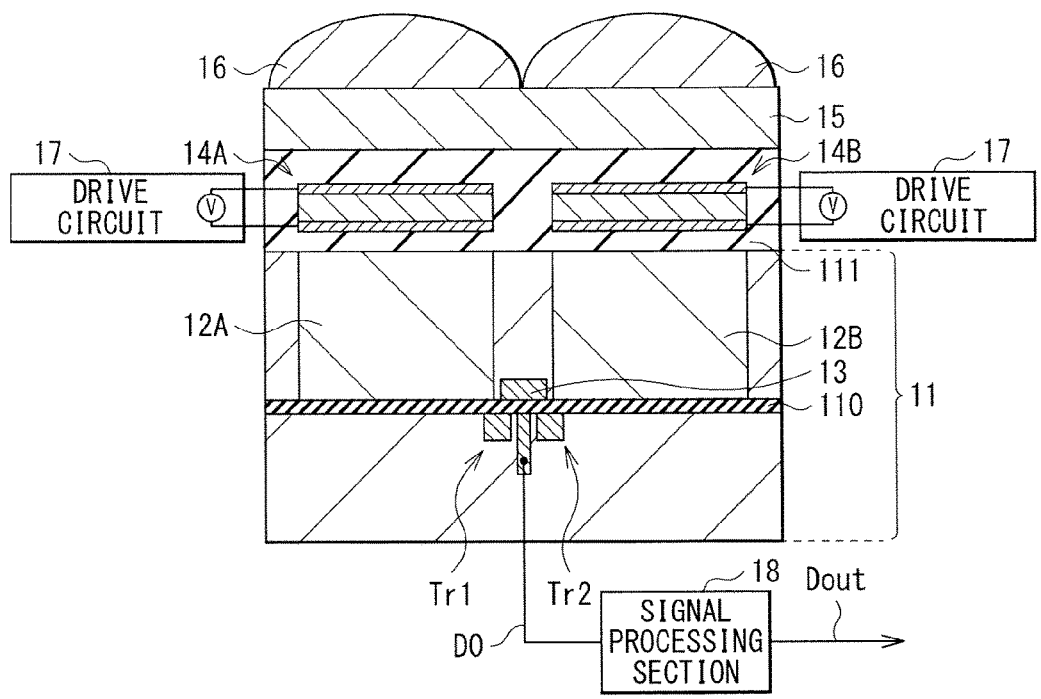
FIG. 3 is a sectional diagram illustrating a configuration example of a chromic mirror illustrated in FIG. 1.
Figure 4A:
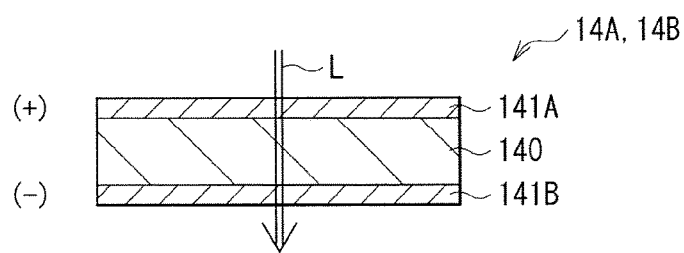
FIG. 4A is a schematic sectional diagram illustrating one example (a transmissive state) of the chromic mirror.
Figure 4B:
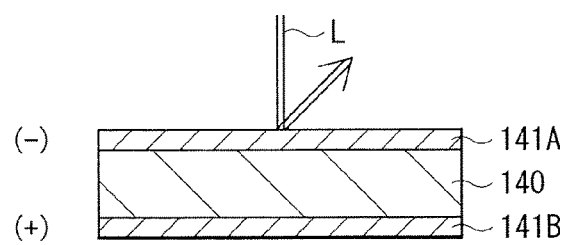
FIG. 4B is a schematic sectional diagram illustrating one example (a reflective state) of the chromic mirror.

FIG. 3 illustrates one specific configuration example when the electrochromic elements have been used as the chromic mirrors 14A and 14B. Since the electrochromic element is favorable in response characteristic in the above-mentioned chromic elements and it is possible to digitally control the transmittance of the electrochromic element with a voltage of about 1V, it may be favorably used as the chromic mirrors 14A and 14B. FIG. 4A illustrates one example of a laminate structure of the chromic mirror 14A (14B) in the transmissive state and FIG. 4B illustrates one example of the laminate structure of the chromic mirror 14A (14B) in the reflective state. The chromic mirror 14A and 14B may be, for example, about 1.5 µm each in thickness and are connected to respective drive circuits 17. It is possible to individually control voltages of the chromic mirrors 14A and 14B by the drive circuits 17.

Each of the chromic mirrors 14A and 14B may include one pair of electrodes 141A and 141B with, for example, an electrochromic layer 140 interposed. Although an example of the material used for the electrochromic layer 140 may include a magnesium-nickel based alloy, a tungsten oxide, a magnesium-titanium based alloy, a Prussian blue type complex and so forth may be also used. The electrodes 141A and 141B are connected to the drive circuit 17 and a transparent conductive film of, for example, at least about 90% in transmittance may be used as each of the electrodes 141A and 141B. Examples of such a transparent conductive film may include nanocarbon materials such as grapheme, carbon nanotube and so forth of, for example, at least about 95% in transmittance, or ITO (an indium tin oxide) of, for example, at least about 90% in transmittance.

In addition, a layer other than the electrochromic layer 140 may be disposed between the electrodes 141A and 141B. For example, a catalyst layer (for example, palladium (Pd), platinum (Pt), silver (Ag) and so forth), a buffer layer (for example, aluminum (Al)), a solid electrolyte layer (for example, a tantalum oxide ($Ta_2O_5$)), an ion storage layer (for example, tungsten bronze (such as $H_xWO_3$)) and so forth may be disposed.

In the above-mentioned configuration, the drive circuit 17 controls a voltage to be applied to the electrochromic layer 140 via the electrodes 141A and 141B to change the transmittances of the chromic mirrors 14A and 14B. It may be possible to control the chromic mirror 14A (14B) to the transmissive state by applying, for example, a positive (+: plus) voltage to the electrode 141A on the light incident side and a negative (−: minus) voltage to the electrode 141B on a light outgoing side (FIG. 4A). On the other hand, it is possible to control the chromic mirror 14A (14B) to the reflective state by applying the negative (−) voltage to the electrode 141A on the light incident side and the positive (+) voltage to the electrode 141B on the light outgoing side (FIG. 4B). That is, it is possible to switch the state of the chromic mirror 14A (14B) between the transmissive state and the reflective state in time-division by applying polarity-inverted voltages to the electrodes 141A and 141B of the chromic mirror 14A (14B) while switching the voltages in time-division.

It is to be noted that in the present embodiment, each of the reflectance and the transmittance of the incident light upon each of the chromic mirrors 14A and 14B may be set to, for example, "1" relative to each of the wavelengths (R, G, B), and the reflectance and the transmittance at which it is possible to switch the state between the transmissive state and the reflective state by applying a voltage of, for example, 1V in a predetermined period (for example, one-frame period) may be desirable. In addition, a transition time (a response time) between the transmissive state and the reflective state is determined in accordance with the configuration, the material quality, an applied voltage and so forth of the electrochromic layer 140. Further, it is desirable that a change in wavelength dependency characteristic of the transmittance or the reflectance be uniform in a visible light range (about 300 nm to about 800 nm both inclusive), The color filter layer 15 may be adapted to make the wavelength of any of, for example, R, G, and B selectively transmit. The color filter layer 15 may be of the kind that for example, a pigment or a dye and so forth is mixed into a resin and a thickness thereof may be, for example, about 0.7 µm. Here, the color filter layers 15 are colored in different colors for every pixel pair 10A in order to detect the same wavelength in the two adjacent pixels a1 and a2. For example, an on-chip lens 16 may be disposed on the color filter layer 15. It is to be noted that not illustrated flattening layer, protection layer and so forth may be formed between the on-chip lens 16 and the color filter layer 15. In addition, a so-called inner lens may be also formed between the color filter layer 15 and the chromic mirrors 14A and 14B.

The on-chip lens 16 may be made of, for example, an inorganic or organic transparent material and is adapted to condense the incident light upon the solid-state image pickup device into the photodiode 12A (or the photodiode 12B). Although the on-chip lens 16 may be disposed per pixel a1 (or the pixel a2), it may be disposed striding over the pixels a1 and a2 as in a later described third embodiment. However, from the viewpoint of resolution of a picked-up image, it is preferable that one on-chip 16 be provided for one pixel a1 (or the pixel a2).

A signal processing section 18 is a circuit section adapted to output an image signal Dout by performing predetermined signal processing (various kinds of signal processing such as resetting, selection, amplification, A/D conversion, gamma correction, white balance adjustment and so forth) on the output signal D0 (a signal charge) obtained from each pixel pair 10A.

[Operations]

In the solid-state image pickup device in the present embodiment, when light is incident upon the pixels a1 and a2 via the on-chip lenses 16, rays of incident light (to explain it in details, rays of light that have transmitted through the chromic mirrors 14A and 14B in the incident light as described later) are received (absorbed) by the photodiodes 12A and 12B and are subjected to photoelectric conversion. Thus, signal charges (for example, electrons) are generated in the photodiodes 12A and 12B and the generated signal charges are transferred to the FD 13 at a predetermined timing (by turning the transfer transistors Tr1 and Tr2 ON). The signal charges that have been read out from the respective pixels a1 and a2 in this way are input into the signal processing section 18 as the output signals D0. The output signals D0 are subjected to predetermined signal processing by the signal processing section 18 and are then output to the outside (or stored into a not illustrated memory section and so forth) as an image signal Dout. It is to be noted that driving for reading-out of the output signals D0 from the respective pixels a1 and a2 is performed by a later described peripheral circuit section 130.

Here, in the present embodiment, the output signals D0 are acquired from the pixels a1 and a2 by driving the chromic mirrors 14A and 14B and while controlling the transmittances of the chromic mirrors 14A and 14B. Thus, an image picking-up operation (a first image picking-up operation) using such a global shutter function as described hereinbelow is performed.

Figure 5:
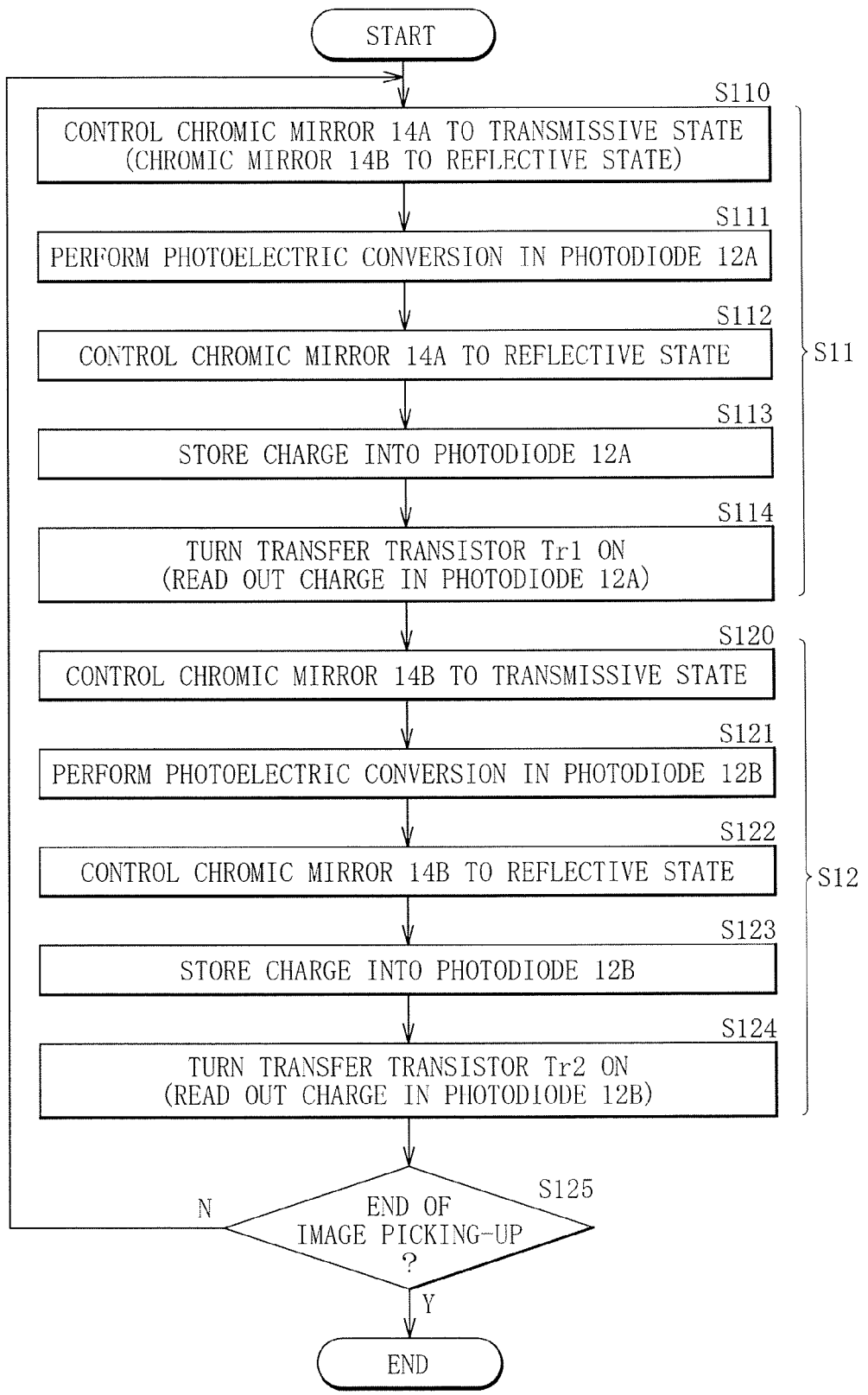
FIG. 5 is a flowchart illustrating one example of a driving operation (an image picking-up operation using a global shutter function) by the solid-state image pickup device illustrated in FIG. 1.

FIG. 5 is a flowchart illustrating one example of the image picking-up operation by the global shutter function using the chromic mirrors 14A and 14B as described above. FIG. 6A to FIG. 6F schematically illustrate examples of a series of operations of exposure, photoelectric conversion, signal charge storage, and signal charge reading-out performed in the pixel pair 10A.

Figure 6A:
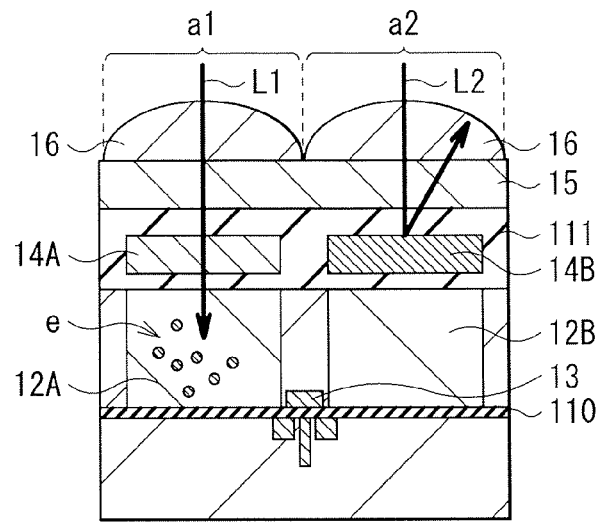
FIG. 6A is an explanatory schematic sectional diagram illustrating one example of the driving operation by the solid-state image pickup device illustrated in FIG. 1.

In the present embodiment, first, the chromic mirror (here, it is assumed to be the chromic mirror 14A) of one of the pixels a1 and a2 is controlled to the transmissive state and the chromic mirror (the chromic mirror 14B) of the other pixel is controlled to the reflective state (step S110). Thus, in the pixel a1, incident light L1 transmits through the chromic mirror 14A, while in the pixel a2, incident light L2 is reflected by the chromic mirror 14B and the pixel a1 is exposed to light as illustrated in FIG. 6A. As a result, in the pixel a1, the light that has transmitted through the chromic mirror 14A is subjected to photoelectric conversion by the photodiode 12A (step S111).

Figure 6B:
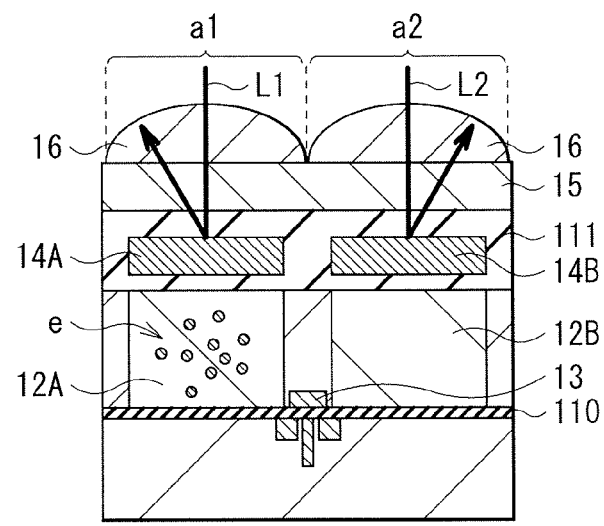
FIG. 6B is an explanatory schematic sectional diagram illustrating one example of an operation succeeding to the operation in FIG. 6A.

Then, the chromic mirror 14A of the pixel a1 is controlled to the reflective state (switching from the transmissive state to the reflective state) (step S112). Thus, the photodiode 12A enters a state that signal charges (for example, electrons e) generated by photoelectric conversion performed in an exposure period (a period that the chromic mirror 14A is being controlled to the transmissive state) have been stored as illustrated in FIG. 6B (step S113). That is, it is possible to control the exposure period of the pixel a1 by controlling the chromic mirror 14A and the photodiode 12A functions as a memory region that temporarily saves the signal charges.

Figure 6C:
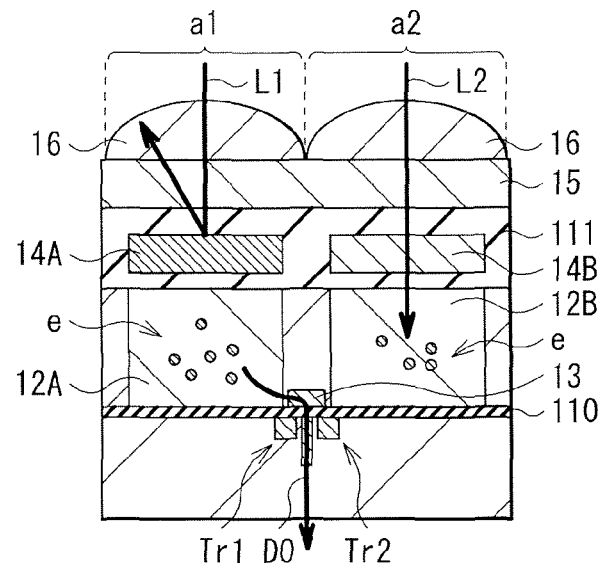
FIG. 6C is an explanatory schematic sectional diagram illustrating one example of an operation succeeding to the operation in FIG. 6B.

Thereafter, the transfer transistor Tr1 is turned ON to read out the signal charges stored in the photodiode 12A into the FD 13 (step S114). In the above-mentioned case, the transfer transistor Tr2 is turned OFF. Thus, the output signal D0 from the pixel a1 is obtained as illustrated in FIG. 6C. The operations of exposure, photoelectric conversion, signal charge storage, and signal charge reading-out are performed in the pixel a1 in this way (step S110 to step S114). The respective operations in the series of step S110 to step S114 (referred to as step S11) are performed in all of the pixel pairs 10A.

Figure 6D:
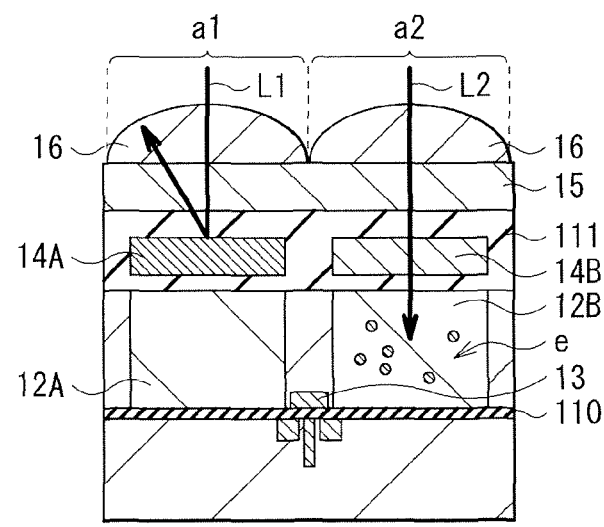
FIG. 6D is an explanatory schematic sectional diagram illustrating one example of an operation succeeding to the operation in FIG. 6C.

On the other hand, the chromic mirror 14B of the pixel a2 is controlled to the transmissive state and the chromic mirror 14A is controlled to the reflective state in synchronization with a timing of reading-out of the signal from the above-mentioned photodiode 12A (step S114) or immediately after signal reading-out has been performed (the chromic mirror 14A is maintained in the reflective state) (step S120). Thus, the incident light L2 transmits through the chromic mirror 14B in the pixel a2, while the incident light L1 is reflected by the chromic mirror 14A in the pixel a1, and the pixel a2 is exposed to light as illustrated in FIG. 6D. As a result, the light that has transmitted through the chromic mirror 14B is subjected to photoelectric conversion by the photodiode 12B in the pixel a2 (step S121).

Figure 6E:
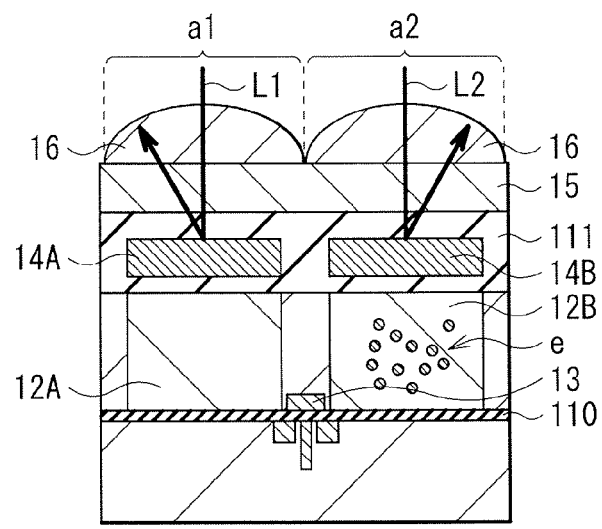
FIG. 6E is an explanatory schematic sectional diagram illustrating one example of an operation succeeding to the operation in FIG. 6D.
Figure 6F:
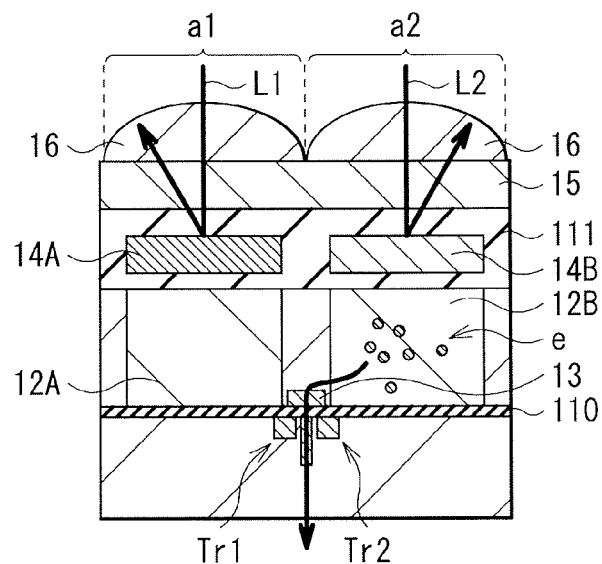
FIG. 6F is an explanatory schematic sectional diagram illustrating one example of an operation succeeding to the operation in FIG. 6E.

Then, the chromic mirror 14B of the pixel a2 is controlled to the reflective state (switching from the transmissive state to the reflective state) (step S122). Thus, the photodiode 12B enters a state that the signal charges (for example, the electrons e) generated by photoelectric conversion in the exposure period (the period that the chromic mirror 14B is being controlled to the transmissive state) have been stored as illustrated in FIG. 6E (step S123). That is, it is possible to control the exposure period in the pixel a2 and the photodiode 12B functions as the memory region that the signals are temporarily saved by controlling the chromic mirror 14B.

Thereafter, the transfer transistor Tr2 is turned ON to read out the signal charges stored in the photodiode 12B into the FD 13 (step S124). In the above-mentioned case, the transfer transistor Tr1 is turned OFF. Thus, the output signal D0 from the pixel a2 is obtained. The operations of exposure, photoelectric conversion, signal charge storage and signal charge reading-out are performed in the pixel a2 in this way (step S120 to step S124). The respective operations in the series of step S120 to step S124 (referred to as step S12) are performed in all of the pixel pairs 10A. Then, it is possible to acquire images which are continuous temporally by alternately and repetitively performing the above-mentioned step S11 and step S12 on the pixel pairs 10A until image picking-up is terminated (Y in step S125).

It is possible to control the exposure period of each of the photodiodes 12A and 12B to be constant within a pixel section surface by alternately reading out the output signals D0 from the pixels a1 and a2 while controlling the transmittances of the chromic mirrors 14A and 14B.

Here, in a general CMOS image sensor, since the signal charges stored in photodiodes are sequentially read out per pixel or per pixel row after exposure has been started, the exposure period of each pixel is not maintained constant and distortion may occur in a picked-up image, for example, when a subject is moving. As a function of improving such distortion, the global shutter function may be given. However, in a general global shutter function, a memory region to which the charges generated by photoelectric conversion are transferred and stored is additionally and separately installed. Thus, the photodiode region (the light receiving region) is reduced and an incident light amount range (the dynamic range) for acquiring proper output signals is reduced. This may become a problem in particular under such environments as, for example, under the strong sunlight, on a snow-covered mountain on a clear day, on the seashore on a clear day and so forth. Therefore, there is a technique that a reduction in dynamic range is avoided by disposing an overflow path between the photodiode region and the memory region and transferring photo-charges that have overflown in the photodiode region to the memory region via the overflow path. In addition, there is also a technique that the photo-charges that have overflown in the memory region are held by designing so as to modulate a potential barrier between the memory region and the photodiode region. Various designs are made in order to compensate for disadvantages due to the presence of the memory region in the global shutter function as mentioned above. However, it may be necessary to install a light shielding film for shielding the memory region and a plurality of transistors for transfer and therefore the structure may be liable to be complicated. In addition, as refinement of pixels and drive voltage reduction are promoted, a transfer structure may become more complicated. As a result, potential designing of a transfer path may become complicated, noise may be increased due to a transfer failure and the image quality may be considerably degraded.

On the other hand, in the present embodiment, it is possible to control the exposure periods of the pixels a1 and a2 to be constant in all of the pixels (all of the pixel pairs 10A) by controlling the chromic mirrors 14A and 14B and thus it is possible to reduce distortion of the picked-up image as mentioned above. That is, it is possible to implement the global shutter function. In addition, since it is possible to make the photodiodes 12A and 12B temporarily function as the memory regions, it is not necessary to additionally and separately provide the memory region. Therefore, it is possible to avoid a reduction in dynamic range that would occur in a general global shutter function and it is also possible to obtain such an effect that designing of the transfer path is simplified to reduce the transfer noise.

In addition, it is also possible to perform the image picking-up operation without utilizing the global shutter function by reading out signals while controlling both of the chromic mirrors 14A and 14B to the transmissive states. In addition, whether the image picking-up operation using the global shutter function is to be executed may be set by input of an external signal. It is possible to freely switch use/disuse of the global shutter function by controlling the chromic mirrors 14A and 14B in this way.

In the solid-state image pickup device according to the present embodiment, driving for reading out the output signals D0 from the pixels a1 and a2 is performed while controlling the transmittances of the chromic mirrors 14A and 14B disposed on the light incident sides of the photodiodes 12A and 12B in the pixel pair 10A as described above. Thus, it is possible to control the exposure period of each pixel and it may become possible to implement, for example, the global shutter function. That is, it is possible to implement the image picking-up function and other additional functions.

Modification Example 1

Figures 7, 8:
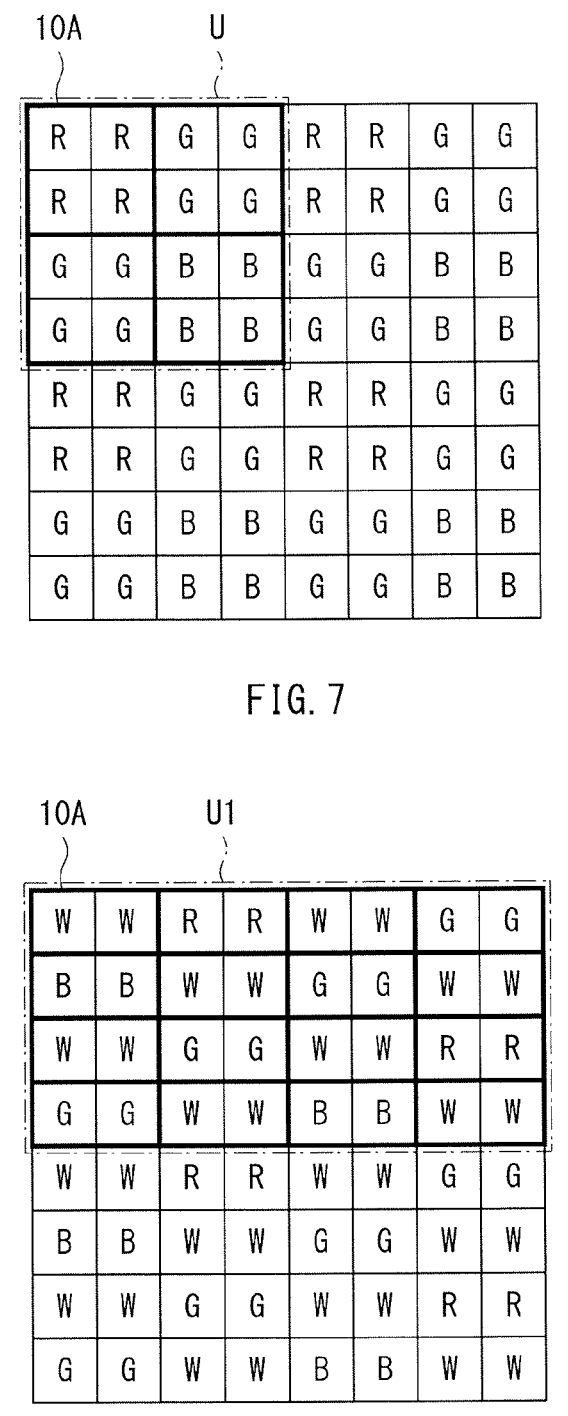

Although a case that the pixel pair 10A includes two pixels has been exemplified in the above-mentioned first embodiment, the pixel pair 10A may include three or more pixels. For example, a Bayer array may be formed by setting four adjacent pixels to the same wavelength as illustrated in FIG. 7. The above-mentioned driving may be performed by grouping these four pixels as the pixel pair 10A. In this case, the floating diffusion may be shared among the four pixels.

Modification Example 2

Alternatively, a W (white) pixel may be used in addition to the three pixels of R, G, and B. For example, four pixels of R, G, B, and W may be configured as a unit array U1 as illustrated in FIG. 8. In this case, a color filter may not be installed for the W pixel or a film which is free from absorption in the visible light region (for example, about 300 nm to about 800 nm both inclusive) may be formed, for example, under the on-chip lens 16. It is possible to increase luminance by using the W pixel in this way.

Second Embodiment

In the following, a solid-state image pickup device according to a second embodiment of the present disclosure will be described. In the following description, the same numerals are assigned to the constitutional elements which are the same as those in the first embodiment and description thereof is appropriately omitted.

[Configuration]
(Pixel Structure)

Figures 9, 10:
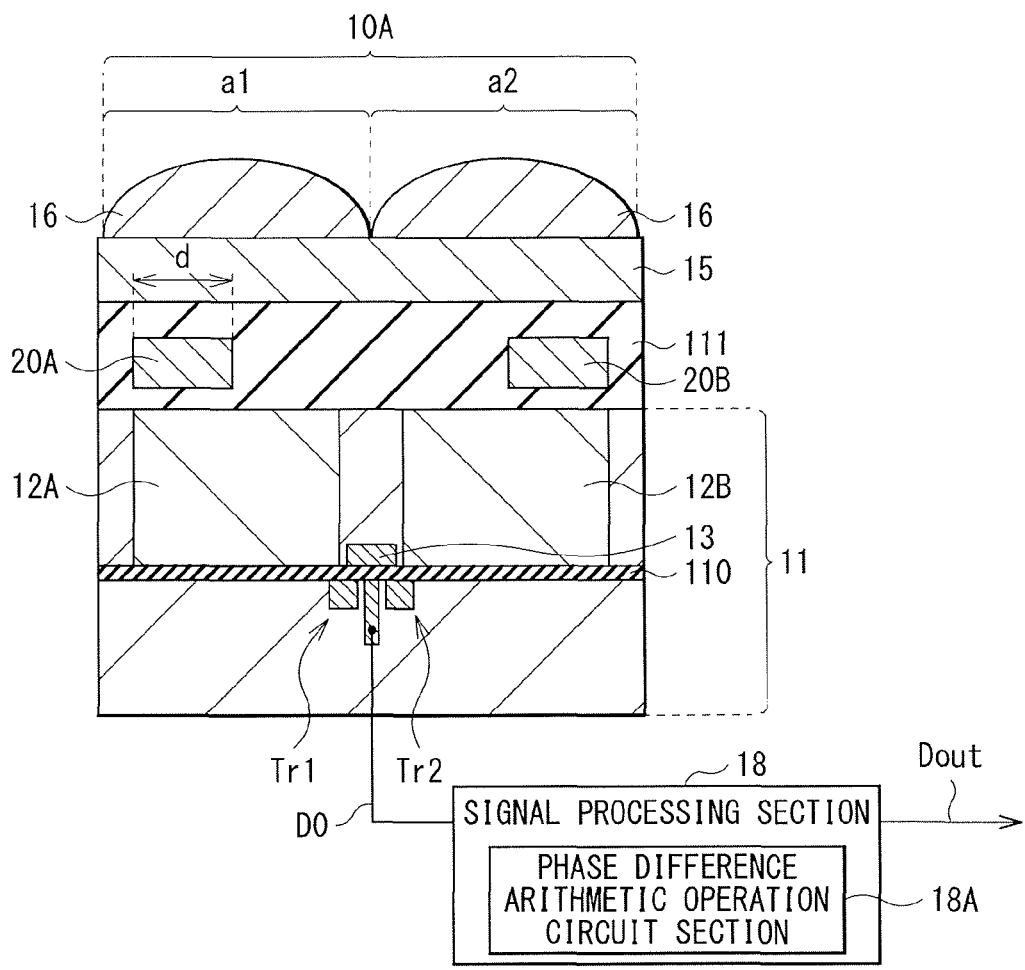
FIG. 9 is a sectional diagram illustrating one example of a configuration of main parts of a solid-state image pickup device according to a second embodiment of the present disclosure.
FIG. 10 is an explanatory schematic diagram illustrating one example of a pixel array of the solid-state image pickup device illustrated in FIG. 9.
Figure 11:
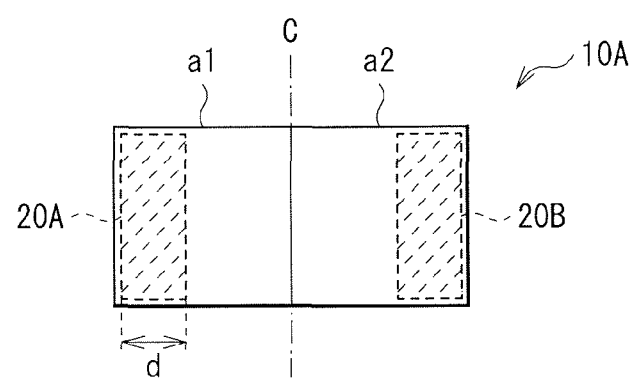
FIG. 11 a schematic diagram illustrating one layout example of a chromic mirror illustrated in FIG. 9.

FIG. 9 illustrates one example of a configuration of main parts of the solid-state image pickup device according to the second embodiment of the present disclosure. FIG. 10 illustrates one example of a pixel array (a color array) of the present embodiment. FIG. 11 illustrates one example of an arrangement of chromic mirrors in a pixel pair. The solid-state image pickup device according to the present embodiment may be configured by, for example, the CCD or CMOS image sensor and so forth in the same way as in the first embodiment and has a configuration that a plurality of pixels are arranged two-dimensionally in the image pickup pixel region (the later described pixel section 1a). In addition, also in the present embodiment, two pixels a1 and a2 in the plurality of pixels are formed as one set (the pixel pair 10A) and the signal charges (the output signals D0) are acquired from the pixel pair 10A by alternately (or sequentially) driving the pixels a1 and a2 in the same way as in the first embodiment. The pixels a1 and a2 respectively include the photodiodes 12A and 12B and may detect the wavelength of any of, for example, R, G, and B.

The pixels a1 and a2 (the pixel pair 10A) may be arranged either adjacently or separately as long as the pixels configure one set of pixels adapted to mutually detect the same wavelength also in the present embodiment. For example, the pixels may be in the form of the Bayer array that includes the unit array U of R, G, and B as illustrated in FIG. 10 in the same way as in the above-mentioned first embodiment. In addition, the transfer transistors Tr1 and Tr2 are provided respectively for the pixels a1 and a2 and the FD is shared between the pixels a1 and a2 also in the present embodiment. In addition, chromic mirrors (chromic mirrors 20A and 20B) are disposed on the light incident sides of the photodiodes 12A and 12B, and the color filter 15 and the on-chip lens 16 are formed on the chromic mirrors 20A and 20B. The on-chip lens 16 is provided for each of the pixels a1 and a2. The chromic mirrors 20A and 20B correspond to one specific example of a "transmittance control element" in one embodiment of the present disclosure.

The chromic mirrors 20A and 20B may be embedded in, for example, the insulating layer 111 formed on the rear surface (the surface on the light receiving side) of the substrate 11 in the same way as the chromic mirrors 14A and 14B in the above-mentioned first embodiment. In addition, the chromic mirrors are elements that make it possible to change (adjust) the transmittance of the incident light by the external input and are configured by such chromic elements as described above. Thus, driving may be performed so as to, for example, reversibly undergo a transition (switching) between the transmissive state and the reflective state also in the chromic mirrors 20A and 20B.

However, the chromic mirrors 20A and 20B are disposed so as to cover only parts (face only parts) of the respective light receiving surfaces of the photodiodes 12A and 12B in the present embodiment. For example, the chromic mirrors 20A and 20B may be formed in half or less regions of the pixels a1 and a2 and a width d of each mirror may be set to half or less (for example, about 1 μm) of, for example, the width of the pixel as illustrated in FIG. 11. In addition, the chromic mirrors 20A and 20B may be disposed in opposition so as to form a gap (a slit) relative to the pixel pair 10A, and may be disposed, for example, symmetrically relative to a boundary line C of the pixel pair 10A. However, layouts such as the arrangement, the widths and so forth of the chromic mirrors 20SA and 20B are not limited to the above. Any layout may be made as long as it is possible to limit the light receiving region of the entire pixel pair 10A by controlling (controlling to light-shielded states) the transmittances of the chromic mirrors 20A and 20B.

In addition, although details will be described later, the chromic mirrors 20A and 20B do not necessarily have to be disposed on all of the pixels and may be selectively disposed on a part of pixels (one or more pixel pairs 10A).

Figure 12A:
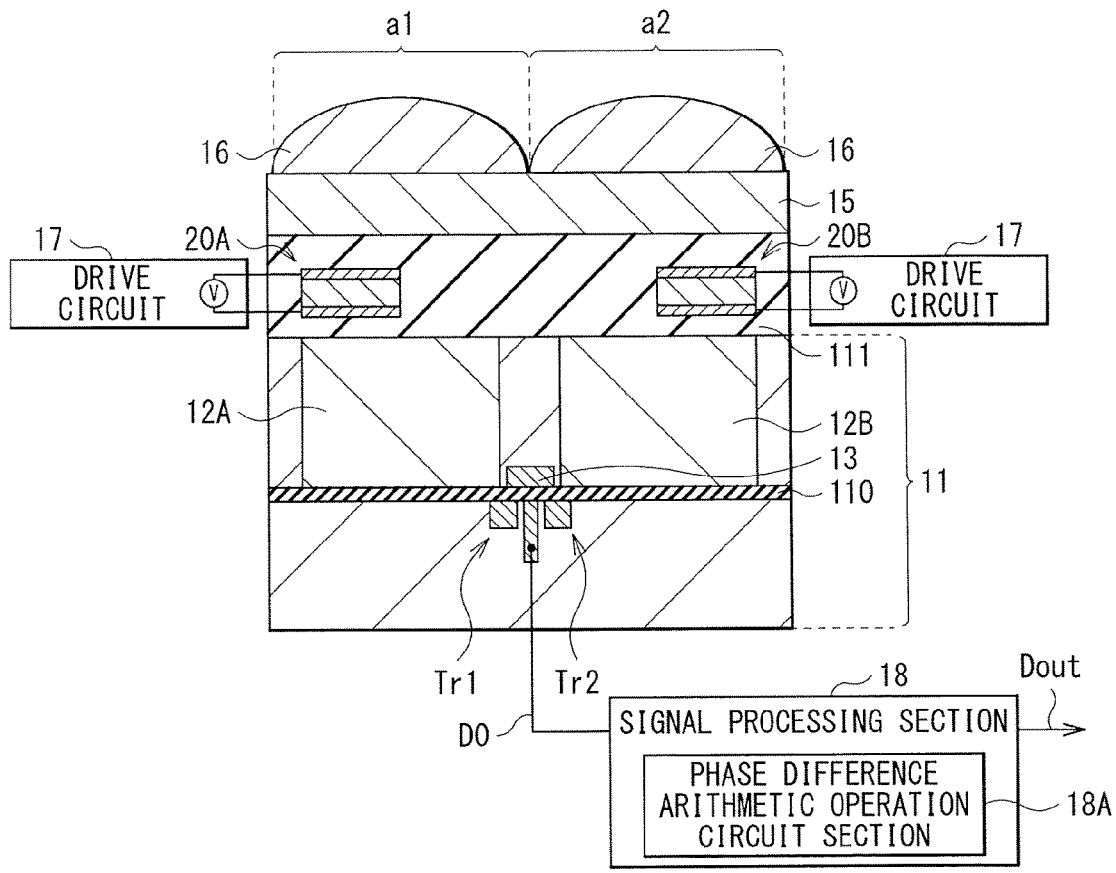
FIG. 12A is a sectional diagram illustrating one configuration example of the chromic mirror illustrated in FIG. 9.
Figure 12B:
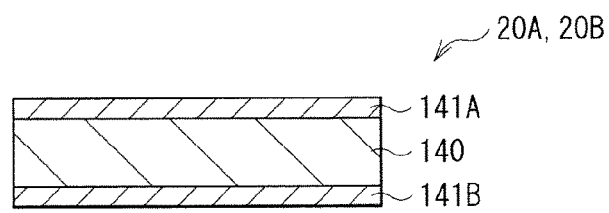
FIG. 12B is a sectional diagram of the chromic mirror illustrated in FIG. 12A.

FIG. 12A illustrates one configuration example when the electrochromic elements have been used as the chromic mirrors 20A and 20B. FIG. 12B illustrates one example of a laminate structure of the chromic mirror 20A (20B). The chromic mirrors 20A and 20B may be, for example, about 1.5 μm each in thickness similarly to the chromic mirrors 14A and 14B in the above-mentioned first embodiment, and are connected to the respective drive circuits 17. It is possible to individually control the voltages of the chromic mirrors 20A and 20B by the drive circuits 17. In addition, the laminate structure of each of the chromic mirrors 20A and 20B is also the same as that of each of the chromic mirrors 14A and 14B in the above-mentioned first embodiment, and each of the chromic mirrors 20A and 20B includes the one pair of electrodes 141A and 141B with the electrochromic layer 140 made of the above-mentioned material and so forth interposed.

In the above-mentioned configuration, each of the drive circuits 17 changes the transmittance of each of the chromic mirrors 20A and 20B by controlling the voltage to be applied to the electrochromic layer 140 via the electrodes 141A and 141B. It is possible to control the chromic mirror 20A (20B) to the transmissive state by, for example, applying the positive (+) voltage to the electrode 141A on the light incident side and the negative (−) voltage to the electrode 141B on the light outgoing side (in the same way as in FIG. 4A). On the other hand, it is possible to control the chromic mirror 20A (20B) to the reflective state by applying the negative (−) voltage to the electrode 141A on the light incident side and the positive (+) voltage to the electrode 141B on the light outgoing side (in the same way as in FIG. 4B). It is possible to undergo switching between the transmissive state and the reflective state in time-division by controlling the voltage also in the chromic mirror 20A (20B) as mentioned above in the same way as in the above-mentioned chromic mirrors 14A and 14B.

It is possible to control the light receiving regions of, for example, the photodiodes 12A and 12B by controlling the transmittances of the chromic mirrors 20A and 20B as mentioned above in the present embodiment.

The signal processing section 18 is a circuit section adapted to output the image signal Dout by performing the predetermined signal processing (various kinds of signal processing such as resetting, selection, amplification, A/D conversion, gamma correction, white balance adjustment and so forth) on the output signal D0 (the signal charge) obtained from each pixel pair 10A as described above. However, although details will be described layer, there is further included an arithmetic operation circuit section (a phase difference arithmetic operation circuit section 18A) adapted to perform phase difference detection, comparison and so forth for a focusing operation on the basis of the output signal D0 when the focusing operation (an auto-focus mode) is to be performed in the present embodiment.

[Operations]

In the solid-state image pickup device according to the present embodiment, when light is incident upon the pixels a1 and a2 via the on-chip lenses 16, rays of the incident light are received (absorbed) by the photodiodes 12A and 12B and are subjected to photoelectric conversion in the same way as in the above-mentioned first embodiment. Thus, the signal charges (for example, the electrons) are generated in the photodiodes 12A and 12B and the generated signal charges are transferred to the FD 13 at predetermined timings. The signal charges read out from the respective pixels a1 and a2 are input into the signal processing section 18 as the output signals D0.

Here, the output signals D0 are acquired alternately from the pixels a1 and a2 while controlling the transmittances of the chromic mirrors 20A and 20B by driving the chromic mirrors 20A and 20B also in this embodiment in the same way as in the above-mentioned first embodiment. At that time, the focusing operation that utilizes the image surface phase difference and an image picking-up operation (a second image picking-up operation) are performed as described later in the present embodiment.

Figure 13:
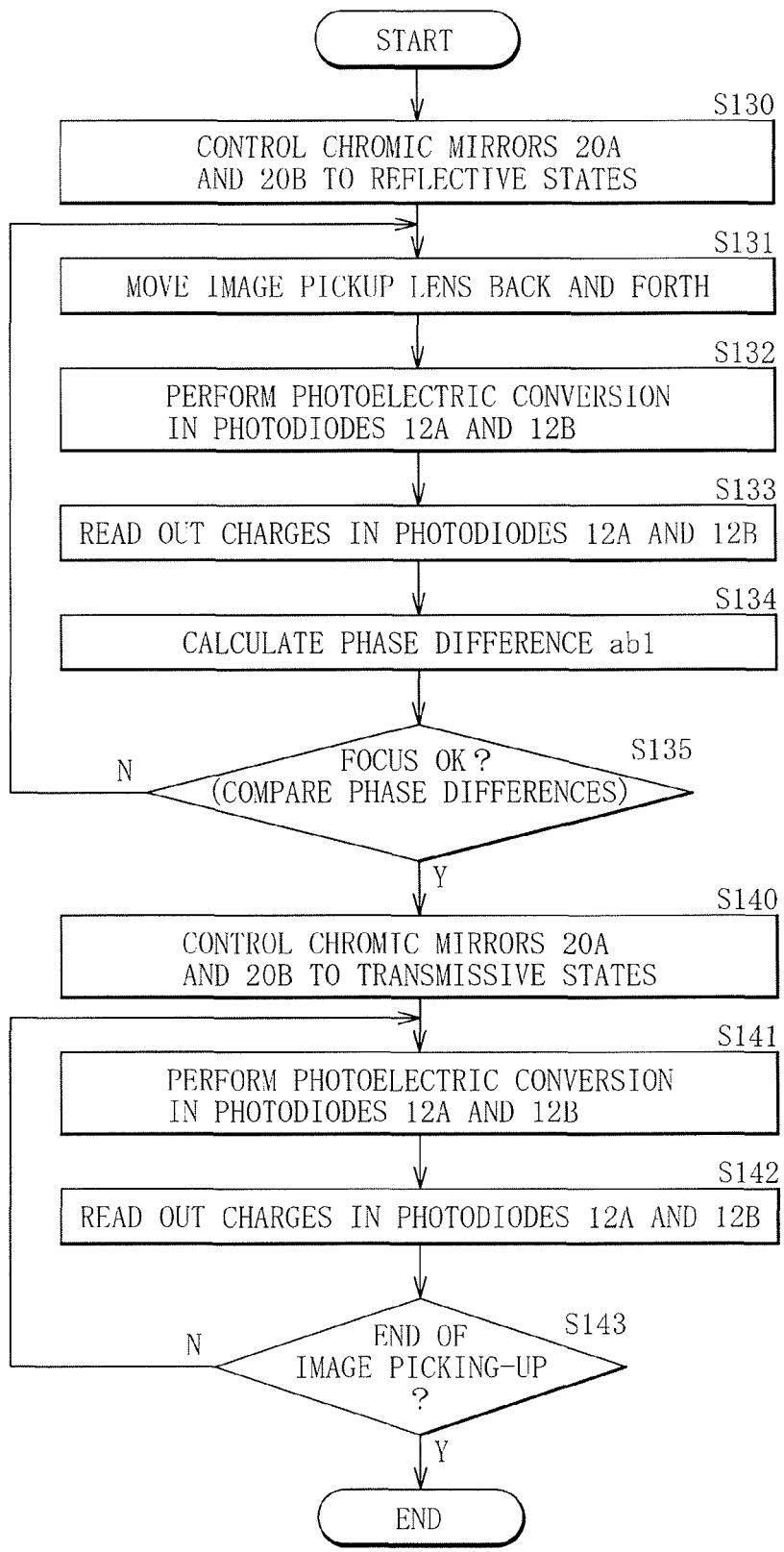
FIG. 13 is a flowchart illustrating one example of a driving operation (a focusing operation using an image surface phase difference and an image picking-up operation) by the solid-state image pickup device illustrated in FIG. 9.
Figure 14:
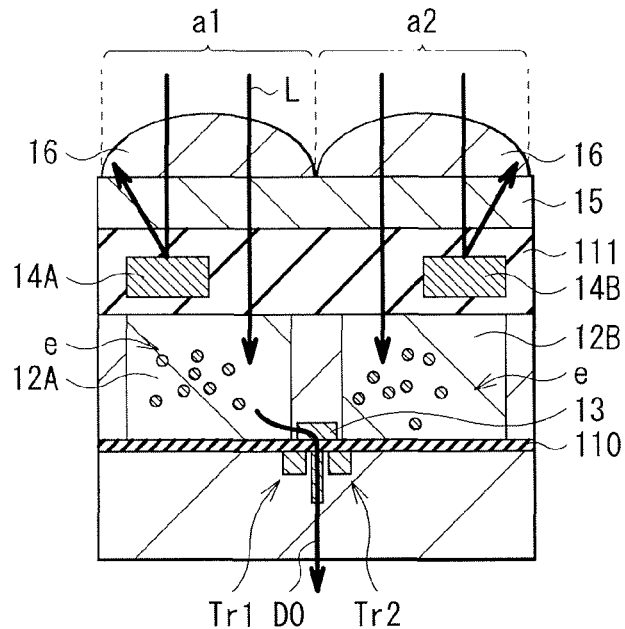
FIG. 14 is an explanatory schematic sectional diagram illustrating one example of the focusing operation by the solid-state image pickup device illustrated in FIG. 9.
Figure 17:
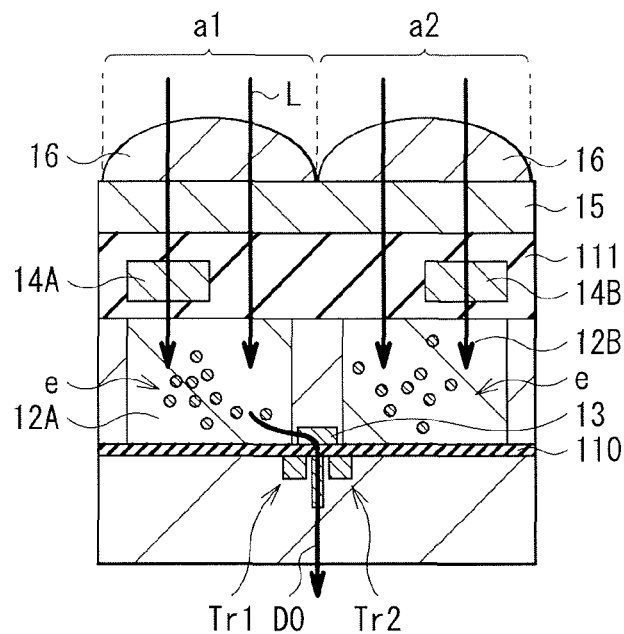
FIG. 17 is an explanatory schematic sectional diagram illustrating one example of the image picking-up operation by the solid-state image pickup device illustrated in FIG. 9.

FIG. 13 is a flowchart illustrating one example of the focusing operation and the image picking-up operation to be performed using the chromic mirrors 20A and 20B as described above. FIG. 14 schematically illustrates one example of the state of exposure, photoelectric conversion, signal charge storage, and signal charge reading-out in the pixel pair 10A upon execution of the focusing operation (the auto-focusing mode). FIG. 17 schematically illustrates one example of the state of exposure, photoelectric conversion, signal charge storage, and signal charge reading-out in the pixel pair 10A upon execution of the image picking-up operation (an imaging mode).

(Focusing Operation: Auto-Focusing Mode)

In the present embodiment, first, both of the chromic mirrors 20A and 20B of the pixels a1 and a2 are controlled to the reflective states (step S130). Then, an image pickup lens (a camera lens) that is disposed on the light incident side of the solid-state image pickup device is moved back and forth along an optical axis (step S131). Rays of light that have passed through regions not covered with the chromic mirrors 20A and 20B in incident light L upon the pixels a1 and a2 are incident upon the photodiodes 12A and 12B as illustrated in FIG. 14. The rays of incident light are subjected to photoelectric conversion by the photodiodes 12A and 12B and generate the signal charges (for example, the electrons e) (step S132). The chromic mirrors 20A and 20B function as slits by controlling the chromic mirrors 20A and 20B to the reflective states and the light receiving region of the pixel pair 10A is controlled as described above.

Then, the output signals D0 (referred to as output signals Da and Db) are alternately read out from the photodiodes 12A and 12B via the FD 13 by alternately (sequentially) turning the transfer transistors Tr1 and Tr2 ON (step S133). The output signals Da and Db so read out in a state that the light receiving regions are being restricted as described above have mutually different phases. These output signals Da and Db are input into the signal processing section 18.

Figure 15:
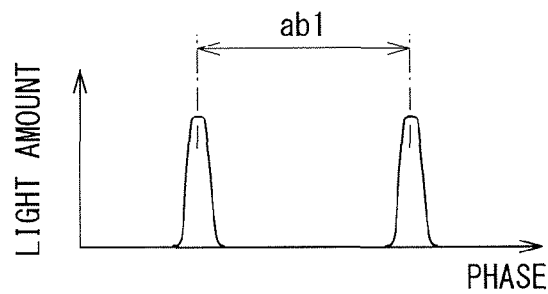
FIG. 15 is an explanatory schematic diagram illustrating one example of the focusing operation using the image surface phase difference.
Figure 16:
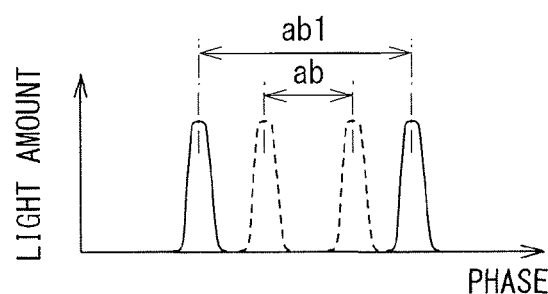
FIG. 16 is an explanatory schematic diagram illustrating one example of the focusing operation using the image surface phase difference.

In the signal processing section 18, the phase difference arithmetic operation circuit section 18A calculates a phase difference ab1 (for example, FIG. 15) on the basis of the output signals Da and Db (step S134). Here, the phase difference arithmetic operation circuit section 18A holds in advance a phase difference obtained when the image pickup lens is in-focus as a reference phase difference (a reference phase difference ab) and compares the reference phase difference ab with the calculated phase difference ab1 to determine in-focus/out-of-focus (step S135). As a result, when the phase difference ab1 has matched the reference phase difference ab, "in-focus" is determined (Y in step S135) and the process proceeds to the next step (the image picking-up operation). On the other hand, when the phase difference ab1 does not match the reference phase difference ab (for example, see FIG. 16) as a result of determination, "out-of-focus" is determined (N in step S135) and processing operations in the above-mentioned step S131 to the step S135 are again performed returning to the above-mentioned step S131. Phase difference detection and comparison are performed while controlling the chromic mirrors 20A and 20B to the reflective states and moving the image pickup lens in this way. The focus is automatically determined by repetitively performing the series of these 0processing operations until "in-focus" is obtained as the result of determination.

(Image Picking-Up Operation: Imaging Mode)

Next, when general imaging is to be performed (after the above-mentioned focusing operation has been performed), both of the chromic mirrors 20A and 20B of the pixels a1 and a2 are controlled to the transmissive states (step S140). Thus, rays of the incident light L upon the pixels a1 and a2 are not shielded by the chromic mirrors 20A and 20B and almost all rays of the incident light L are incident upon the photodiodes 12A and 12B. The rays of the incident light L are subjected to photoelectric conversion by the photodiodes 12A and 12B and generate the signal charges (for example, the electrons e) (step S141). Then, the output signals D0 are alternately read out from the photodiodes 12A and 12B via the FD 13 by alternately (sequentially) turning the transfer transistors Tr1 and Tr2 ON (step S142). Then, step S141 and step S142 are repetitively performed until image-picking-up is completed (Y in step S143). The obtained output signals D0 are input into the signal processing section 18.

It is possible to receive the light by the whole regions of the photodiodes 12A and 12B by controlling the chromic mirrors 20A and 20B to the transmissive states and by reading out the output signals D0 from the pixel pair 10A in this way, that is, it is possible to perform photoelectric conversion without restricting the light receiving region.

Here, the auto-focusing function performed using an image surface phase difference in a general CMOS image sensor may be, for example, as follows. That is, slits are disposed in a light receiving surface of the image sensor at predetermined intervals and phases of light rays that are incident through the slits are changed (a phase difference is caused to occur) by moving the image pickup lens back and forth. This auto-focusing function is a function of automatically adjusting the focus by comparing this phase difference with a phase difference in an in-focus state. However, in this case, since the slits occupying almost a half area of each pixel are placed on the light receiving surface, the substantial light receiving region is reduced. Thus, the sensitivity is reduced. In addition, when pixels having much noise (white points) are arranged around the so slit-formed pixel for phase difference detection as mentioned above, image correction becomes difficult and image quality degradation is induced. Therefore, there is a technique and so forth that the phase difference is detected while suppressing a reduction in sensitivity by disposing narrow slits in respective pixels at positions that are displaced from the optical axis little by little, for example, in a set of three pixels and performing correlation arithmetic processing on a light quantity position variation from these three pixels. However, since the light shielding region is formed by such a technique of arranging the slits in the light receiving surfaces as mentioned above, it is difficult to obtain the output which is equal to that from the pixel with no slit.

On the other hand, in the present embodiment, it is possible to change the light receiving regions (the light receiving areas) in the pixels a1 and a2 in accordance with an operation mode (the auto-focusing mode or the imaging mode) by controlling the states of the chromic mirrors 20A and 20B. Therefore, it is possible to implement the image surface phase difference auto-focusing function without reducing the sensitivity upon execution of the general image picking-up. In addition, image picking-up may be performed by freely switching the mode between the auto-focusing mode and the imaging mode, for example, with the external input signal with the aid of reversible control of the transmittances of the chromic mirrors 20A and 20B.

In the solid-state image pickup device according to the present embodiment, driving for reading out the output signals D0 from the pixels a1 and a2 is performed while controlling the transmittances of the chromic mirrors 20A and 20B disposed on the light incident sides of the photodiodes 12A and 12B in the pixel pair 10A as described above. Thus, it is possible to control the light receiving region in each pixel and it may become possible to implement the auto-focusing function using, for example, the image surface phase difference. That is, it is possible to implement the image picking-up function and other additional functions.

In the following, arrangement examples of the chromic mirrors 20A and 20B will be described as modification examples of the above-mentioned second embodiment.

Modification Example 3-1

Figure 18A:
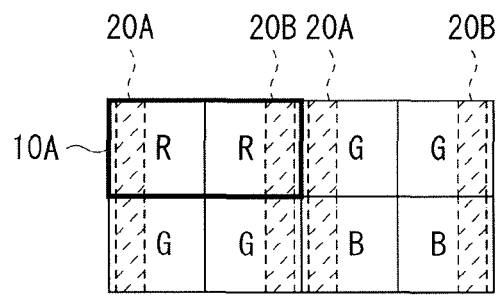
FIG. 18A is a schematic diagram illustrating one arrangement example of a chromic mirror according to a modification example 3-1.

FIG. 18A illustrates one arrangement example of the chromic mirrors 20A and 20B according to the modification example 3-1. The chromic mirrors 20A and 20B may be disposed in all of the pixels in a pixel array that two pixels configures one pixel pair 10A as illustrated in FIG. 18A. It is possible to adjust the focus onto an arbitrary position of a picked-up image region by disposing the chromic mirrors 20A and 20B in all of the pixels (all of the pixel pairs 10A) as described above. In addition, in this case, it is possible to compensate for a reduction in luminance by interpolating the output signal from a certain pixel using the output signals from its surrounding pixels by signal processing performed by the signal processing section 18. In addition, although voltage application to the chromic mirrors 20A and 20B may be individually performed per pixel, it is possible to reduce power consumption by performing voltage application per pixel column (or pixel row).

Modification Example 3-2

Figure 18B:
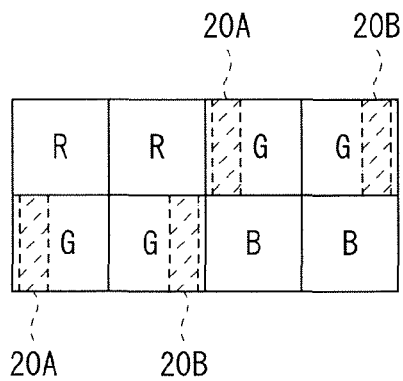
FIG. 18B is a schematic diagram illustrating one arrangement example of a chromic mirror according to a modification example 3-2.

FIG. 18B illustrates one arrangement example of the chromic mirrors 20A and 20B according to the modification example 3-2. The chromic mirrors 20A and 20B may be disposed in a part of pixel pairs 10A (for examples, the pixel pairs 10A including the G pixels) in a pixel array that two pixels configure one pixel pair 10A as illustrated in FIG. 18B.

Modification Example 4-1

Figure 19A:
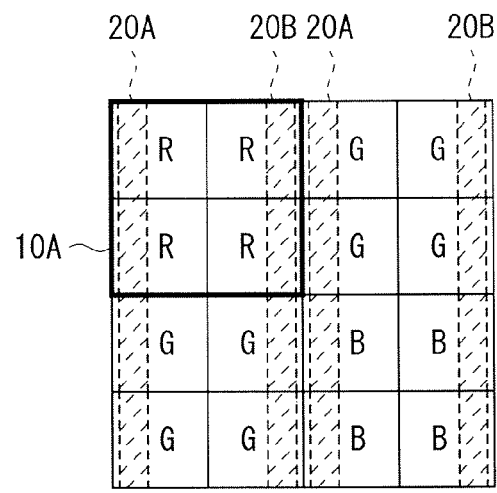
FIG. 19A is a schematic diagram illustrating one arrangement example of a chromic mirror according to a modification example 4-1.

FIG. 19A illustrates one arrangement example of the chromic mirrors 20A and 20B according to the modification example 4-1. The chromic mirrors 20A and 20B may be disposed in all of the pixels in a pixel array (for example, the pixel array in FIG. 7) that four pixels configure one pixel pair 10A as illustrated in FIG. 19A. Thus, it becomes possible to adjust the focus onto an arbitrary position of the picked-up image region. In addition, it is possible to compensate for the reduction in luminance by performing interpolation as mentioned above by the signal processing section 18. Further, it is possible to reduce power consumption by performing voltage application to the chromic mirrors 20A and 20B per pixel column (or pixel row).

Modification Example 4-2

Figure 19B:
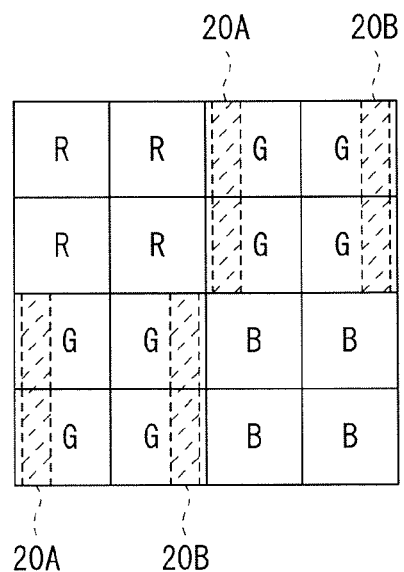
FIG. 19B is a schematic diagram illustrating one arrangement example of a chromic mirror according to a modification example 4-2.

FIG. 19B illustrates one arrangement example of the chromic mirrors 20A and 20B according to the modification example 4-2. The chromic mirrors 20A and 20B may be disposed in a part of pixel pairs 10A (for example, the pixel pairs 10A including the G pixels) in a pixel array (for example, the pixel array in FIG. 7) that four pixels configure one pixel pair 10A as illustrated in FIG. 19B.

Modification Example 5-1

Figure 20A:
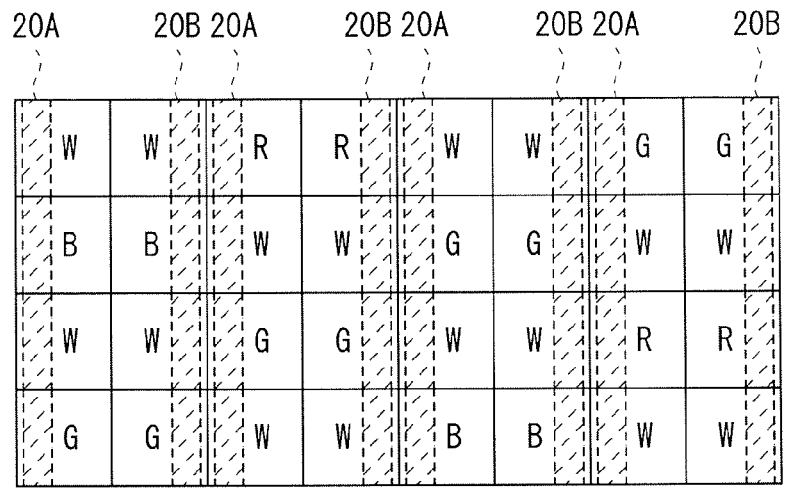
FIG. 20A is a schematic diagram illustrating one arrangement example of a chromic mirror according to a modification example 5-1.

FIG. 20A illustrates one arrangement example of the chromic mirrors 20A and 20B according to the modification example 5-1. The chromic mirrors 20A and 20B may be disposed in all of the pixels in a pixel array (for example, the pixel array in FIG. 8) using the W pixels as illustrated in FIG. 20A. Thus, it is possible to adjust the focus onto the arbitrary position of the picked-up image region. In addition, since the W pixels are used, it is possible to suppress the reduction in luminance even when disposing the chromic mirrors 20A and 20B in all of the pixels. Further, it is possible to keep power consumption down by performing voltage application to the chromic mirrors 20A and 20B per pixel column (or pixel row).

Modification Example 5-2

Figure 20B:
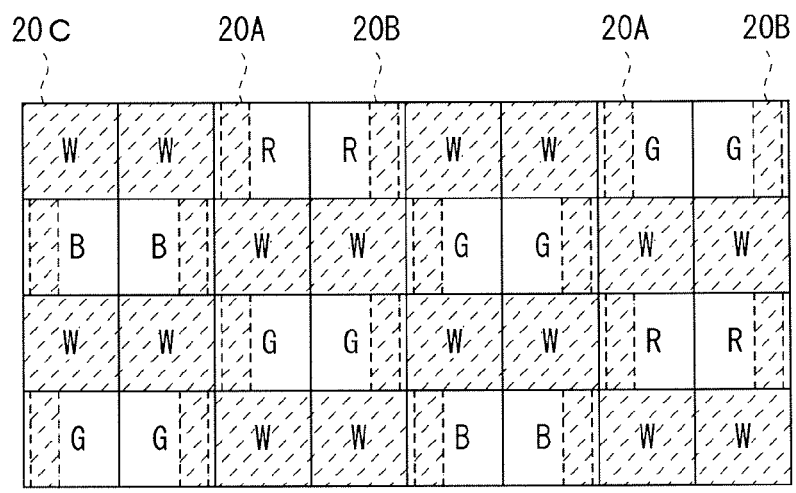
FIG. 20B is a schematic diagram illustrating one arrangement example of a chromic mirror according to a modification example 5-2.

FIG. 20B illustrates one arrangement example of the chromic mirrors 20A and 20B according to the modification example 5-2. The chromic mirrors 20A and 20B may be disposed in each pixel of R, G, and B in the pixel array using the W pixels (for example, the pixel array in FIG. 8) and the chromic mirrors may be disposed so as to cover the whole region of the light receiving surface of the photodiode for the W pixel (that is, similarly to the chromic mirrors 14A and 14B in the above-mentioned first embodiment).

Modification Example 5-3

Figure 20C:
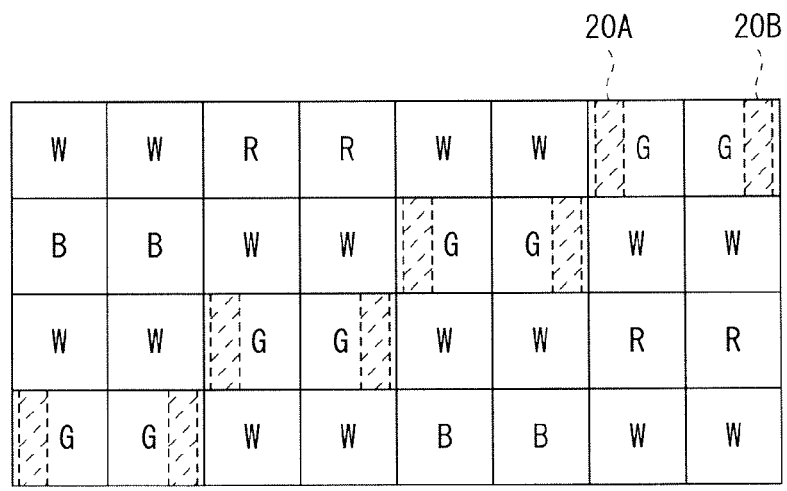
FIG. 20C is a schematic diagram illustrating one arrangement example of a chromic mirror according to a modification example 5-3.

FIG. 20C illustrates one arrangement example of the chromic mirrors 20A and 20B according to the modification example 5-3. The chromic mirrors 20A and 20B may be disposed in a part of pixel pairs 10A (for example, the pixel pairs 10A including the G pixels) in a pixel array using the W pixels (for example, the pixel array in FIG. 8) as illustrated in FIG. 20C.

Third Embodiment

In the following, a solid-state image pickup device according to a third embodiment of the present disclosure will be described. In the following description, the same numerals are assigned to the same constitutional elements as those in the above-mentioned first and second embodiments and description thereof is appropriately omitted.
[Configuration]
(Pixel Structure)

Figures 21, 22:
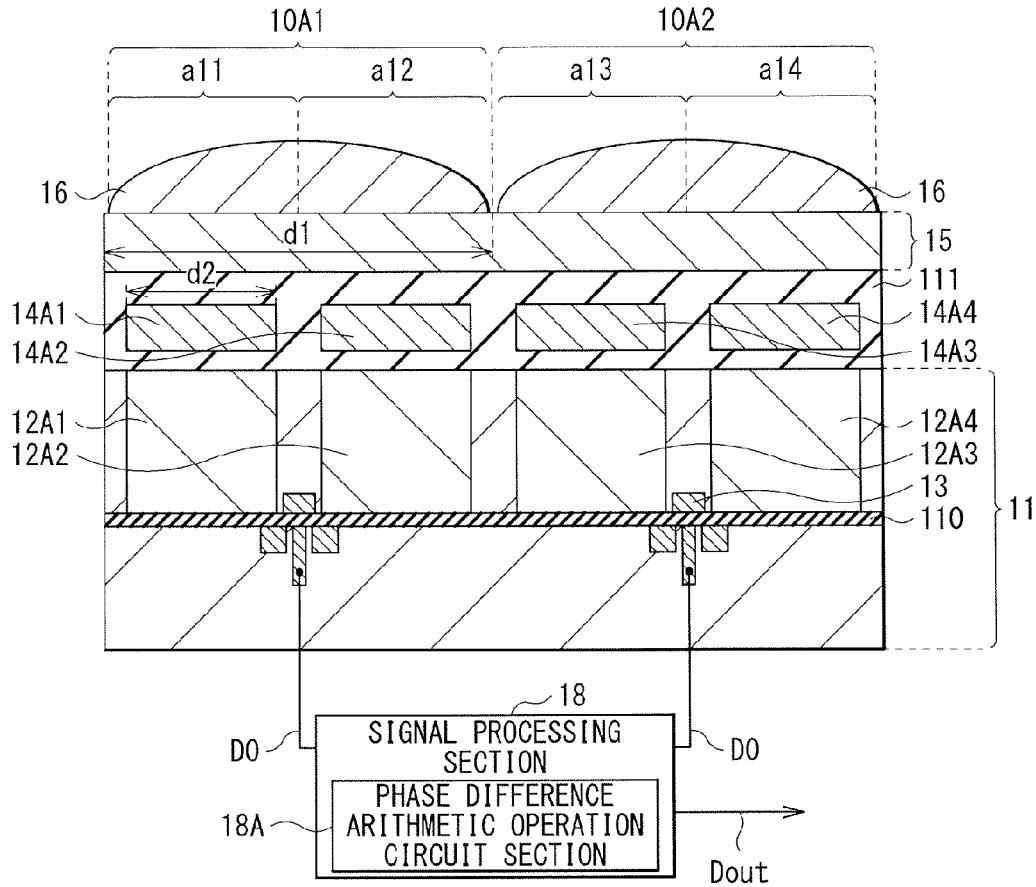
FIG. 21 is a sectional diagram illustrating one example of a configuration of main parts of a solid-state image pickup device according to a third embodiment of the present disclosure.
FIG. 22 is an explanatory schematic diagram illustrating one example of a pixel array of the solid-state image pickup device illustrated in FIG. 21.

FIG. 21 illustrates one example of a configuration of main parts of a solid-state image pickup device according to the third embodiment. FIG. 22 illustrates one example of a pixel array (a color array) of the present embodiment. The solid-state image pickup device according to the present embodiment may be configured by, for example, the CCD or CMOS image sensor and so forth, and has a configuration that the plurality of pixels are two-dimensionally arranged in the picked-up image region (the later described pixel section 1a) in the same way as in the above-mentioned first and second embodiments. In addition, also in the present embodiment, two pixels are grouped as one pixel pair in the plurality of pixels, and the signal charges (the output signals D0) are acquired from the pixel pairs by alternately (or sequentially) driving these two pixels in the same way as in the above-mentioned first and second embodiments. Each pixel includes the photodiode and, for example, may detect the wavelength of any of R, G, B and so forth.

However, the present embodiment is configured such that two adjacent pixel pairs (pixels pairs 10A1 and 10A2) detect the same wavelength. Specifically, one pixel pair 10A1 includes pixels a11 and a12 and the other pixel pair 10A2 includes pixels a13 and a14, and these four pixels a11 to a14 mutually detect the same wavelength. The pixels a11 to a14 may be adjacently arranged side by side, for example, as illustrated in FIG. 22 and the Bayer array of R, G and B is formed as a whole.

In the pixels a11 to a14, photodiodes 12A1 to 12A4 are formed in the substrate 11, and the transfer transistors Tr1 and Tr2 and one FD 13 are disposed in each of the pixel pairs 10A1 and 10A2 in the same way as in the solid-state image pickup device of the above-mentioned first embodiment. The FD 13 of each of the pixel pairs 10A1 and 10A2 is connected to the signal processing section 18. In addition, chromic mirrors 14A1 to 14A4 are disposed on light incident sides of the photodiodes 12A1 to 12A4 so as to cover the whole regions of the respective light receiving surfaces. These chromic mirrors 14A1 to 14A4 may be configured by, for example, the electrochromic elements similarly to the chromic mirrors 14A and 14B in the above-mentioned first embodiment, and each of the chromic mirrors is configured such that the state thereof is reversibly switched between the transmissive state and the reflective state by voltage control as described above. The color filter layer 15 and the on-chip lenses 16 are formed on these chromic mirrors 14A1 to 14A4.

In addition, in the present embodiment, the on-chip lens 16 is disposed not for each of the pixels a11 to a14 but for each of the pixel pairs 10A1 and 10A2 (one on-chip lens 16 is formed striding over the pixels a11 and a12 or the pixels a13 and a14). In addition, a width d1 of each of the pixel pairs 10A1 and 10A2 may be, for example, about 2.5 μm and a width d2 of each of the chromic mirrors 14A1 to 14A4 may be, for example, about 1 μm.

The signal processing section 18 is a circuit section adapted to output the image signal Dout by performing the predetermined signal processing (various kinds of signal processing such as resetting, selection, amplification, A/D conversion, gamma correction, white balance adjustment and so forth) on the output signal D0 (the signal charge) obtained from each pixel pair 10A as described above. In addition, there is further included the phase difference arithmetic operation circuit section 18A adapted to perform phase difference detection, comparison and so forth for the focusing operation also in the present embodiment in the same way as in the above-mentioned second embodiment.

[Operations]

In the solid-state image pickup device according to the present embodiment, when light is incident upon the pixels a11 to a14 via the on-chip lenses 16, rays of the incident light are received (absorbed) by the photodiodes 12A1 to 12A4 and are subjected to photoelectric conversion in the same way as in the above-mentioned first embodiment. Thus, the signal charges (for example, the electrons) are generated in the photodiodes 12A1 to 12A4 and the generated signal charges are transferred to the FD 13 at the predetermined timings. The signal charges read out from the respective pixels a11 to a14 are input into the signal processing section 18 as the output signals D0.

Figure 23A:
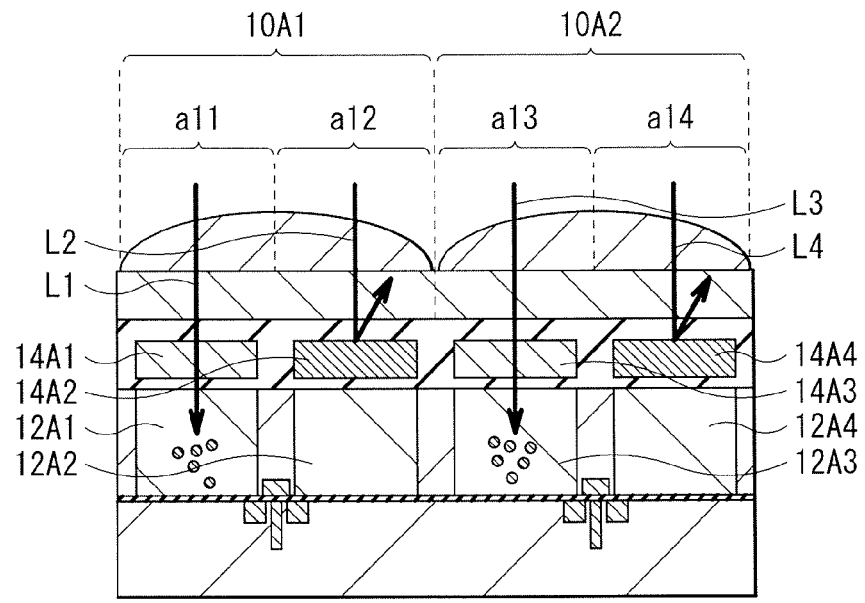
FIG. 23A is an explanatory schematic sectional diagram illustrating one example of the image picking-up operation using a global shutter function of the solid-state image pickup device illustrated in FIG. 21.
Figure 23B:
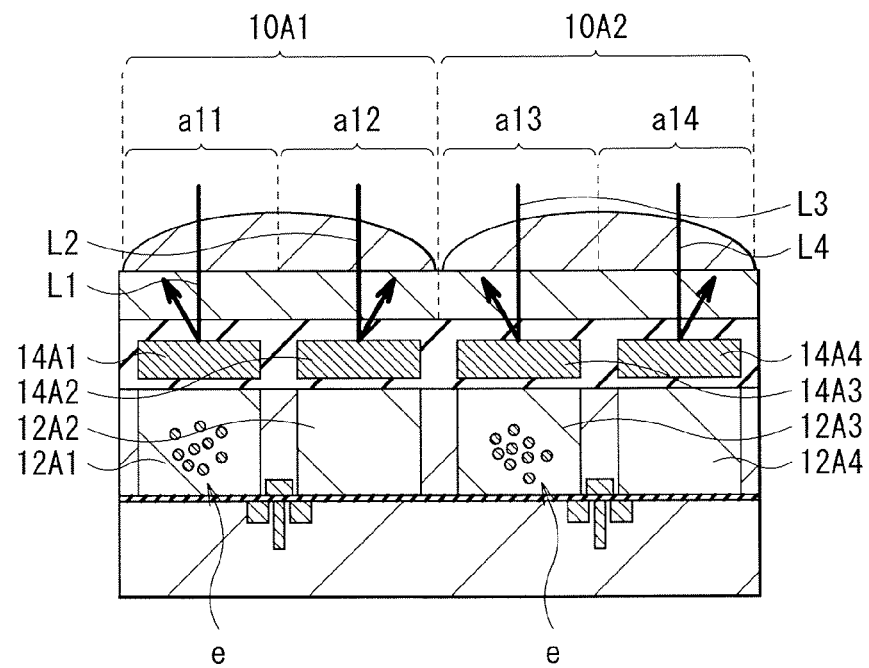
FIG. 23B is an explanatory schematic sectional diagram illustrating one example of an operation succeeding to the operation in FIG. 23A.
Figure 23C:
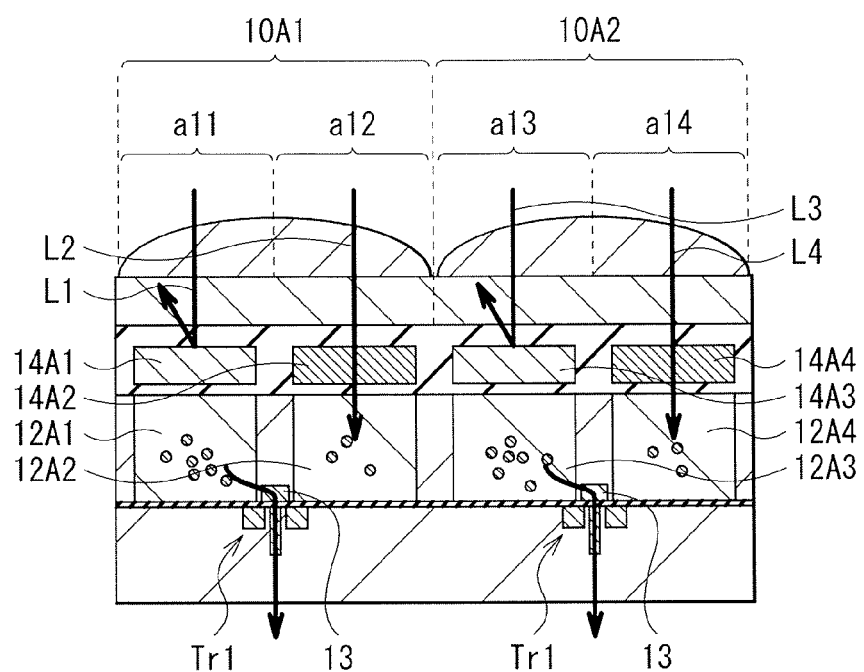
FIG. 23C is an explanatory schematic sectional diagram illustrating one example of an operation succeeding to the operation in FIG. 23B.
Figure 24:
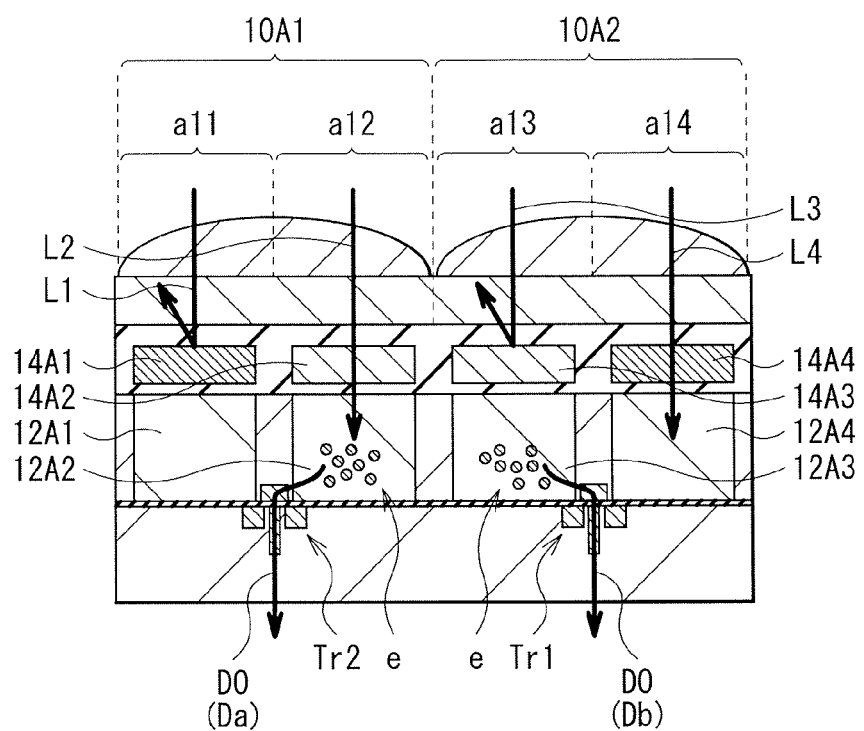
FIG. 24 is an explanatory schematic sectional diagram illustrating one example of the focusing operation by the solid-state image pickup device illustrated in FIG. 9.

Here, in the present embodiment, the on-chip lens 16 is disposed for each of the pixel pairs 10A1 and 10A2 and the output signals D0 are obtained while driving the chromic mirrors 14A1 to 14A4 in these pixel pairs 10A1 and 10A2. Thus, in the present embodiment, it is possible to implement both of the global shutter function of the above-mentioned first embodiment and the image surface phase difference auto-focusing function of the above-mentioned second embodiment as described hereinbelow. FIG. 23A to FIG. 23C schematically illustrate examples of the series of operations of exposure, photoelectric conversion, charge signal storage and charge signal reading-out upon execution of the image picking-up operation using the global shutter function. FIG. 24 schematically illustrates one example of the state of exposure, photoelectric conversion, charge signal storage and charge signal reading-out upon execution of the focusing operation using the image surface phase difference.

(Image Picking-Up Operation Using Global Shutter Function)

When the image picking-up operation using the global shutter function is to be performed, for example, such a driving operation as follows may be performed. First, the chromic mirrors (the chromic mirrors 14A1 and 14A3) of one pixels (for example, the pixels a11 and a13) in the pixel pairs 10A1 and 10A2 are controlled to the transmissive states and the chromic mirrors (the chromic mirrors 14A2 and 14A4) other than the above are controlled to the reflective states as illustrated in FIG. 23A. Thus, in the pixel a11, the incident light L1 transmits through the chromic mirror 14A1, while in the pixel a12, the incident light L2 is reflected by the chromic mirror 14A2, and the pixel a11 is exposed to light in the pixel pair 10A1. In the pixel a13, incident light L3 transmits through the chromic mirror 14A3, while in the pixel a14, incident light L4 is reflected by the chromic mirror 14A4, and the pixel a13 is exposed to light in the pixel pair 10A2 similarly. As a result, rays of light transmitted through the chromic mirrors 14A1 and 14A3 are subjected to photoelectric conversion by the photodiodes 12A1 and 12A3 in the pixels a11 and a13.

Then, the chromic mirrors 14A1 and 14A3 of the pixels a11 and a13 are controlled to the reflective states (switched from the transmissive states to the reflective states) as illustrated in FIG. 23B. Thus, the photodiodes 12A1 and 12A3 enter states that the signal charges (for example, the electrons e) generated by photoelectric conversion in the exposure period (the period that the chromic mirrors 14A1 and 14A3 are being controlled to the transmission states) are stored. The exposure periods of the pixels a11 and a13 are controlled as described above also in the present embodiment in the same way as in the above-mentioned first embodiment, and the photodiodes 12A1 and 12A3 function as memory regions that temporarily save the signal charges.

Thereafter, in the respective pixel pairs 10A1 and 10A2, the transfer transistors Tr1 are turned ON and the signal charges stored in the photodiodes 12A1 and 12A3 are read out to the FD 13 as illustrated in FIG. 23C. Thus, each of the output signals D0 from each of the pixels a11 and a13 is obtained. The operations of exposure, photoelectric conversion, signal charge storage, and signal charge reading-out are performed in the pixels a11 and a13 in this way. The series of these operations are performed in all of the pixel pairs 10A1 and 10A2.

On the other hand, the chromic mirrors 14A2 and 14A4 of the pixels a12 and a14 are controlled to the transmissive states and the chromic mirrors 14A1 and 14A3 thereof are controlled to the reflective states in synchronization with timings of reading out of signals from the above-mentioned photodiodes 12A1 and 12A3 or immediately after execution of signal reading (the chromic mirrors 14A1 and 14A3 maintain the reflective states). Thus, the incident lights L2 and L4 transmit through the chromic mirrors 14A2 and 14A4 in the pixels a12 and a14, while the incident lights L1 and L3 are reflected by the chromic mirrors 14A1 and 14A3 in the pixels a11 and a13, and the pixels a12 and a14 are exposed to light.

The respective operations of exposure, photoelectric conversion, charge signal storage and charge signal reading-out are also performed on the pixels a12 and a14 as on the above-mentioned pixels a11 and a13 in this way. Thus, the exposure periods of the pixels a12 and a14 are controlled in the same way as in the above-mentioned first embodiment and, in addition, the photodiodes 12A2 and 12A4 temporarily function as the memory regions. Then, the transfer transistors Tr2 are turned ON and the signals are read out from the photodiodes 12A2 and 12A4 in the respective pixel pairs 10A1 and 10A2. Thus, the output signals D0 are also obtained from the pixels a12 and a14.

It is possible to control the exposure period in each of the photodiodes 12A1 to 12A4 to be constant in the pixel section surface by alternately reading out the output signals D0 from the pixels a11 and a12 and from the pixels a13 and a14 while controlling the transmittances of the chromic mirrors 14A1 to 14A4 as described above. In addition, it is also possible to make each of the photodiodes 12A1 to 12A4 temporarily function as the memory region. Therefore, it is possible to implement the global shutter function that exhibits the same effect as that obtained by the above-mentioned first embodiment.

(Focusing Operation Using Image Surface Phase Difference)

When the focusing operation using the image surface phase difference is to be performed, for example, such a driving operation as follows may be performed. That is, the chromic mirrors 14A1 and 14A4 of one pixels (for example, the pixels a11 and a14) in the pixel pairs 10A1 and 10A2 are controlled to the reflective states and the chromic mirrors 14A2 and 12A3 of the other pixels (the pixels a12 and a13) in the pixel pairs 10A1 and 10A2 are controlled to the transmissive states as illustrated in FIG. 24. In addition, the image pickup lens (the camera lens) arranged on the light incident side of the solid-state image pickup device is moved back and forth along the optical axis. In the incident lights L1 to L4 upon the pixels a11 to a14, the incident lights L1 and L4 are reflected by the chromic mirrors 14A1 and 14A4 by controlling the chromic mirrors 14A1 and 14A4 to the reflective states and the chromic mirrors 14A2 and 14A3 to the transmissive states. On the other hand, the incident lights L2 and L3 transmit through the chromic mirrors 14A2 and 14A3 and are incident upon the photodiodes 12A2 and 12A3. These incident lights are subjected to photoelectric conversion by the photodiodes 12A2 and 12A3 and generate the signal charges (for example, the electrons e). The chromic mirrors 14A1 to 14A4 function as the slits and the light receiving regions of the pixel pairs 10A1 and 10A2 are controlled also in the present embodiment in the same way as in the above-mentioned second embodiment by controlling the chromic mirrors 14A1 to 14A4 as mentioned above.

Then, the output signals D0 (the output signals Da and Db) are read out from the photodiodes 12A2 and 12A3 via the FD 13 by turning the transfer transistors Tr2 and Tr1 corresponding to the photodiodes 12A2 and 12A3 ON. The output signals Da and Db that have been read out in a state that the light receiving regions are being restricted as described above have mutually different phases. These output signals Da and Db are input into the signal processing section 18.

In the signal processing section 18, the phase difference arithmetic operation circuit section 18A calculates a phase difference on the basis of the output signals Da and Db, compares the calculated phase difference with the reference phase different that has been held in advance, and determines in-focus/out-of-focus. When "in-focus" is obtained as a result of determination, the operation may shift to, for example, the general image picking-up operation or the image picking-up operation by the above-mentioned global shutter function. On the other hand, when "out-of-focus" is obtained as the result of determination, the above-mentioned series of processing operations is performed again. Phase difference detection and comparison are performed by controlling the chromic mirrors 14A1 and 14A4 to the reflective states and the chromic mirrors 14A2 and 14A3 to the transmissive states and while moving the image pickup lens as mentioned above. The focus is automatically determined by repetitively performing the series of these processing operations until "in-focus" is obtained as the result of determination. Therefore, it is possible to implement the image surface phase difference auto-focusing function that exhibits the same effect as that by the above-mentioned second embodiment.

In the solid-state image pickup device according to the present embodiment, driving of reading out the output signals D0 from the pixels a11 to a14 is performed while controlling the transmittances of the chromic mirrors 14A1 to 14A4 disposed on the light incident sides of the photodiodes 12A1 to 12A4 in the two adjacent pixel pairs 10A1 and 10A2 as described above. Thus, it is possible to control the exposure period and the light receiving region of each pixel, and therefore it is possible to implement both of the global shutter function and the image surface phase difference auto-focusing function. That is, it is possible to implement the image picking-up function and other additional functions.

Next, one example of a correcting process to be performed in the image processing section 18 will be described as modification examples (modification examples 6-1 to 6-4) of the solid-state image pickup devices according to the above-mentioned first to third embodiments. In addition, in a modification example 7, other driving operation examples using the pixel structures of the solid-state image pickup device according to the first to third embodiments will be described. It is to be noted that in the following description, the same numerals are assigned to the same constitutional elements as those in the above-mentioned first to third embodiments and description thereof is appropriately omitted. In addition, in description of the modification examples other than the modification example 6-4, description will be made by giving the pixel structure (the pixel pair 10A) of the solid-state image pickup device according to the first embodiment in the solid-state image pickup devices according to the first to third embodiments.

Modification Example 6-1

Figure 25:
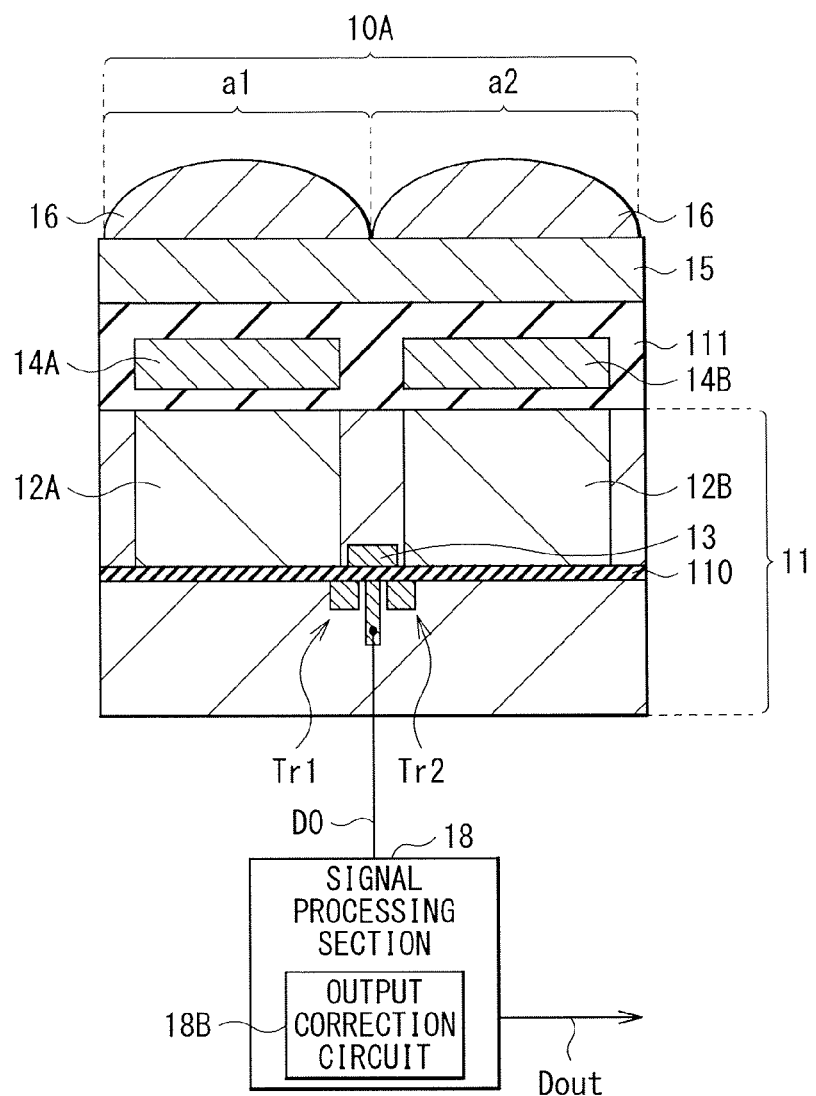
FIG. 25 is a sectional diagram illustrating one example of a configuration of main parts of a solid-state image pickup device that includes a signal processing section according to a modification example 6-1.

FIG. 25 illustrates one example of a configuration of main parts of a solid-state image pickup device according to the modification example 6-1. The solid-state image pickup device according to the present modification example may be configured by, for example, the CCD or CMOS image sensor and so forth similarly to the devices according to the above-mentioned first embodiment and so forth. In the solid-state image pickup device according to the present modification example, the signal processing section 18 includes an output correction circuit 18B.

The output correction circuit 18B is a circuit section adapted to perform correction of the output signal D0 (specifically, a signal based on the output signal D0) by taking effective transmittance (a transmittance Rt) and reflectance (a reflectance Rr) of each of the chromic mirrors 14A and 14B into account. Although description has been made assuming that each of the transmittance and reflectance of each of the chromic mirrors 14A and 14B is set to ideal "1" in the above-mentioned first embodiment and so forth, there are cases when each of the transmittance and the reflectance does not reach 1 due to leak of light (or a loss of light) on each of the chromic mirrors 14A and 14B in reality. In such a case, an output correcting process that the transmittance Rt and the reflectance Rr are taken into account is performed.

Figure 26:
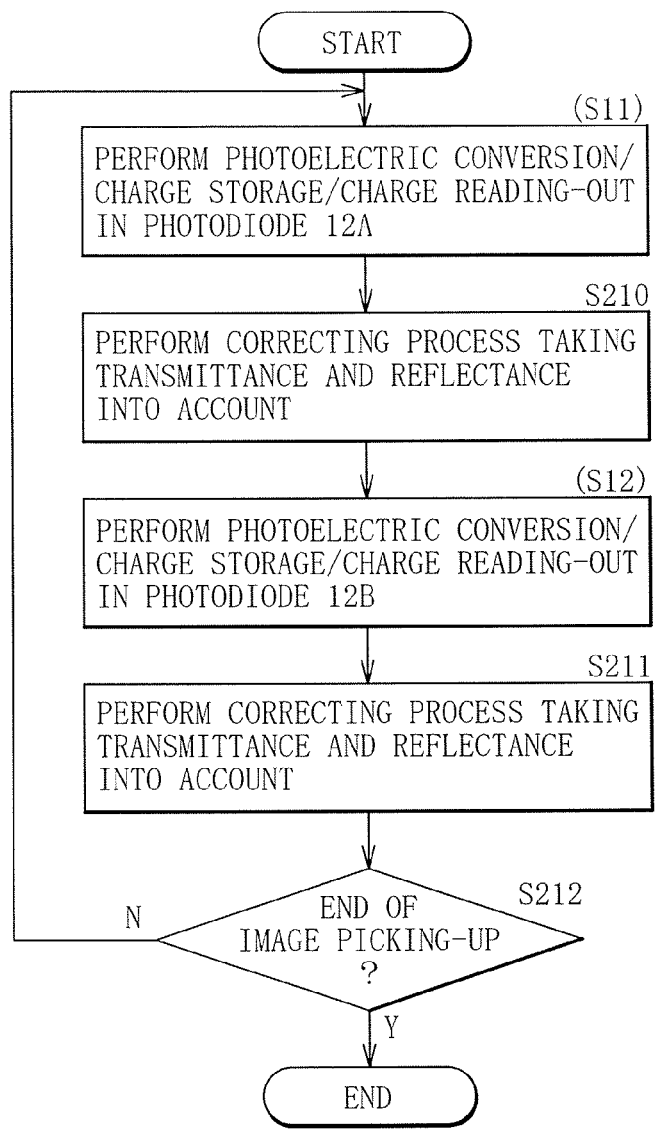
FIG. 26 is a flowchart for explaining one example of a correcting operation by the signal processing section illustrated in FIG. 25.

Specifically, the series of operations (step S11 in the above-mentioned first embodiment) of exposure, photoelectric conversion, signal charge storage, and signal charge reading-out is performed in the photodiode 12A while controlling the transmittances of the chromic mirrors 14A and 14B in the same way as in the above-mentioned first embodiment as illustrated in FIG. 26. Then, when the output signal D0 from the photodiode 12A is input into the signal processing section 18, the signal processing section 18 performs the correcting process that the transmittance and the reflectance are taken into account on the output signal D0 so input (step S210). Then, the series of operations (step S12 in the above-mentioned first embodiment) of exposure, photoelectric conversion, signal charge storage, and signal charge reading-out is performed in the photodiode 12B while controlling the transmittances of the chromic mirrors 14A and 14B in the same way as in the above-mentioned first embodiment. Then, when the output signal D0 from the photodiode 12B is input into the signal processing section 18, the signal processing section 18 performs the correcting process that the transmittance and the reflectance are taken into account on the basis of the output signal D0 so input (step S211). The series of these processing operations (the steps S11, S210, S12, and S211) is repetitively performed until image picking-up is completed (Y in step S212).

Figure 27A:
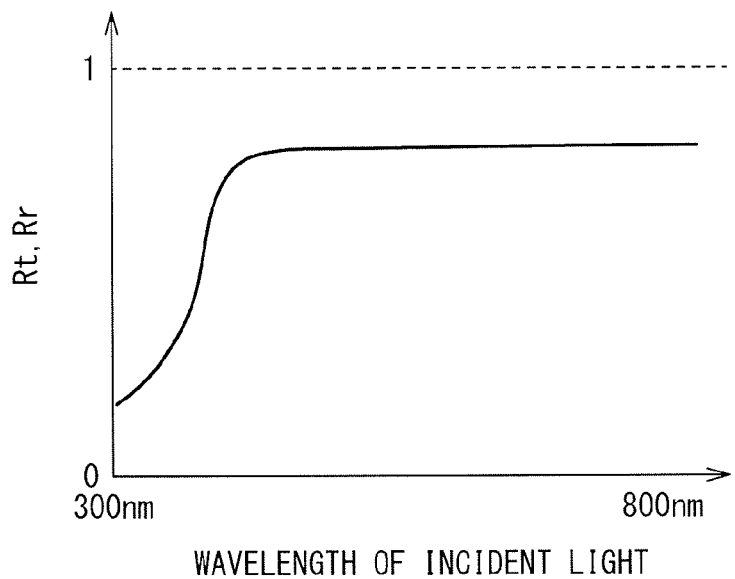
FIG. 27A is one example of data on transmittance/reflectance that the signal processing section illustrated in FIG. 25 holds.

Here, in the above-mentioned steps S210 and S211, the signal processing section 18 specifically performs a correcting process as follows by the output correction circuit 18B. That is, the signal processing section 18 (the output correction circuit 18B) measures in advance the transmittance Rt and the reflectance Rr for incidence wavelengths of light upon the chromic mirrors 14A and 14B and holds a result of measurement (hereinafter, referred to as transmittance/reflectance data). The transmittance Rt and the reflectance Rr for wavelengths (about 300 nm to about 800 nm both inclusive) in a visible range are illustrated as one example of the transmittance/reflectance data in FIG. 27A. Then, output correction is performed by the following correction arithmetic operations using such transmittance/reflectance data.

Figure 27B:
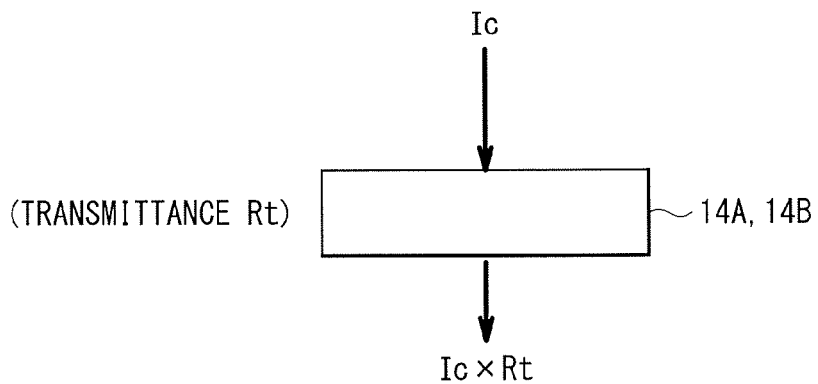
FIG. 27B is an explanatory schematic diagram illustrating one example of derivation of a correction arithmetic expression used for a correcting operation by the signal processing section illustrated in FIG. 25.
Figure 27C:
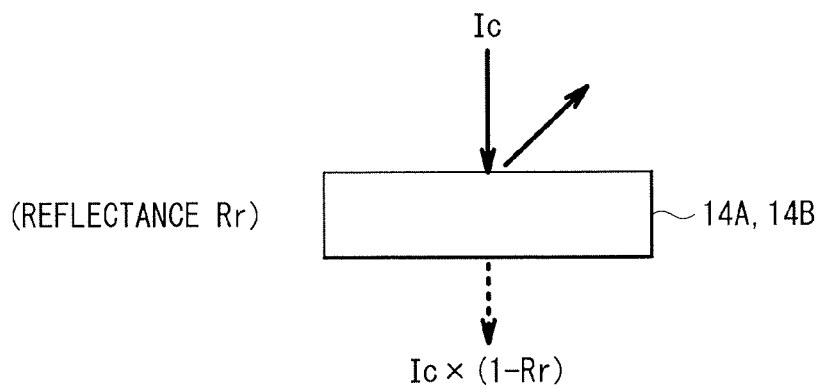
FIG. 27C is an explanatory schematic diagram illustrating one example of derivation of a correction arithmetic expression used for the correcting operation by the signal processing section illustrated in FIG. 25.

That is, assuming that an amount of incident light upon each of the chromic mirror 14A and 14B is Ic, a received light amount in each of the photodiode 12A and 12B in a period (t1) that the chromic mirrors 14A and 14B are in the transmissive states is defined as Ic×Rt (FIG. 27B). On the other hand, the received light amount based on leaked light (transmitted light) in a period (t2) that the chromic mirrors 14A and 14B are in the reflective states is defined as Ic×(1−Rr) (FIG. 27C). However, it is assumed that the incident light amount Ic is not varied in the periods of the times t1 and t2 (for example, t1+t2=one frame period). Since the output signal D0 is acquired on the basis of the transmitted light through the chromic mirrors 14A and 14B in these periods t1 and t2, the received light amount I (the received light amount corresponding to the output signal D0) when using the chromic mirrors 14A and 14B each having the transmittance Rt and the reflectance Rr is expressed by the following expression (1). Therefore, it is possible to obtain the incident light amount Ic by the following expression (2). It is possible to suppress the influence of noise caused by the light loss that would occur in the transmissive states of the chromic mirror 14A and 14B and the light leak that would occur in the reflective states of the chromic mirrors 14A and 14B by correcting the output signal D0 on the basis of the expression (2).

$$I = Ic \times Rt + Ic \times (1-Rr) \times t2/t1 \quad (1)$$

$$Ic = I / \{Rt + Ic \times (1-Rr) \times t2/t1\} \quad (2)$$

The signal processing section 18 may correct the output signal D0 taking the transmittance and reflectance into account as in the present modification example, by which it is possible to implement the above-mentioned various functions (for example, the global shutter function and so forth) while reducing image quality degradation even when the transmittance or the reflectance of each of the chromic mirrors 14A and 14B is not ideal "1".

Modification Example 6-2

Figure 28:
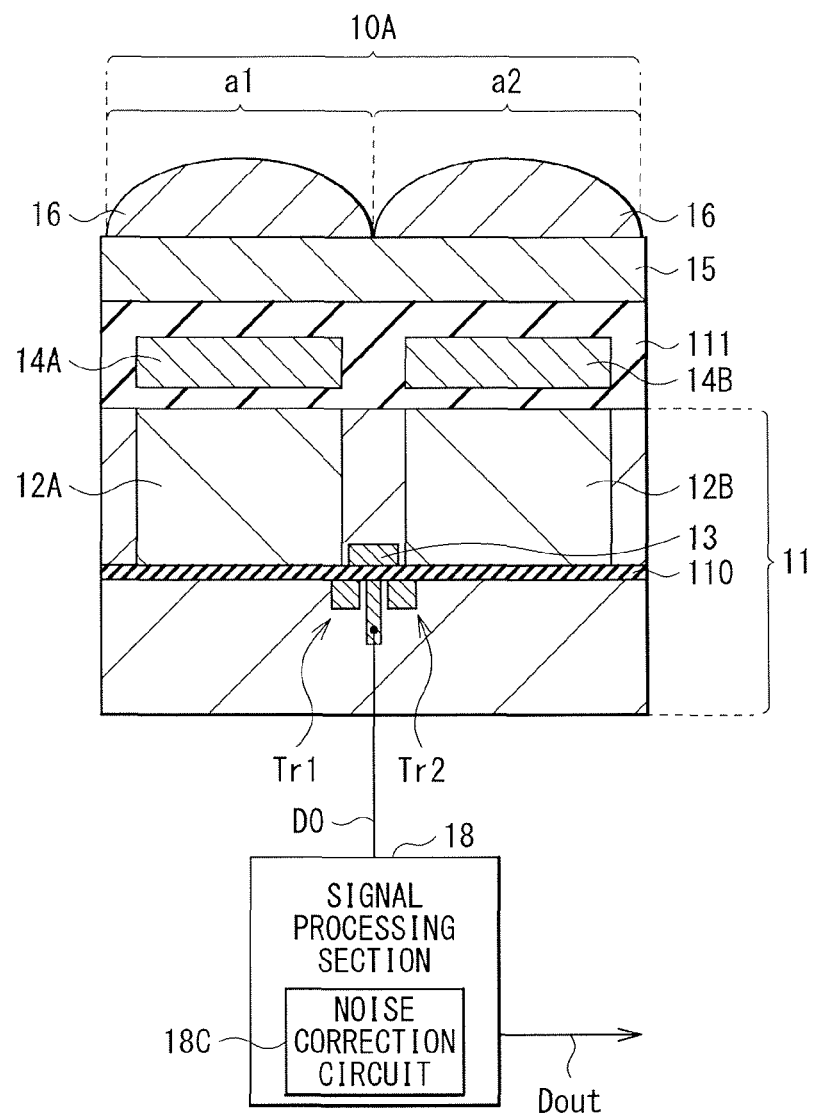
FIG. 28 is a sectional diagram illustrating one example of a configuration of main parts of a solid-state image pickup device that includes a signal processing section according to a modified example 6-2.
Figure 29:
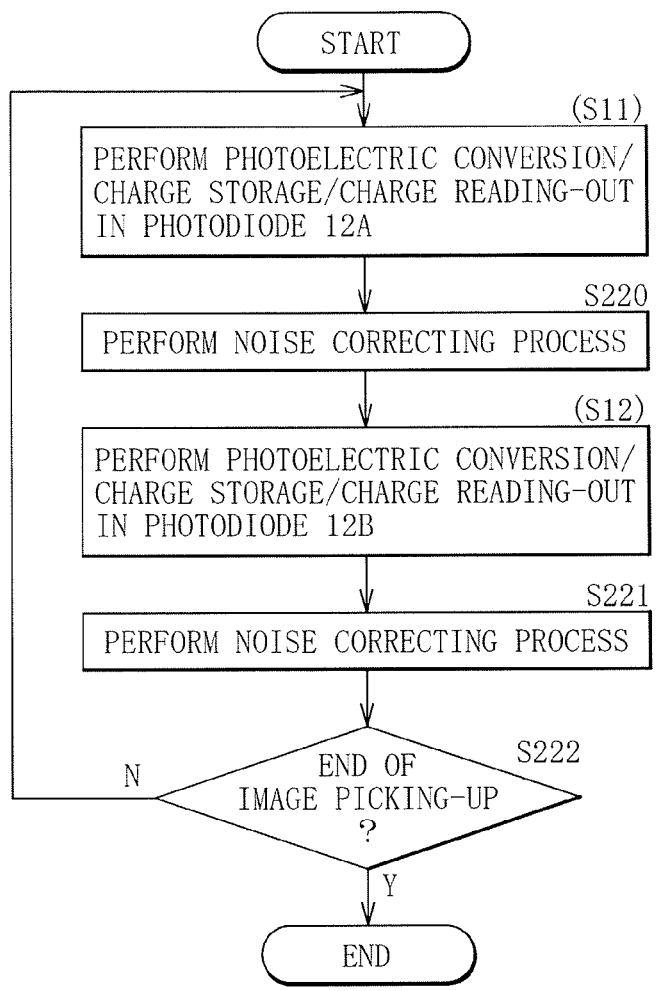
FIG. 29 is a flowchart for explaining one example of a correcting operation by the signal processing section illustrated in FIG. 28.

FIG. 28 illustrates one example of a configuration of main parts of a solid-state image pickup device according to the modification example 6-2. The solid-state image pickup device according to the present modification may be configured by, for example, the CCD or CMOS image sensor and so forth in the same way as in the above-mentioned first embodiment and so forth. In the solid-state image pickup device according to the present modification example, the signal processing section 18 includes a noise correction circuit 18C.

The noise correction circuit 18C is a circuit section adapted to perform correction for removing a noise component (the noise component in a transfer path) generated in a path along which a signal is input, for example, from each of the photodiodes 12A and 12B into the signal processing section 18 via the FD 13 from the output signal D0 (or a signal based on the output signal D0).

Specifically, the signal processing section 18 performs a noise correcting process by the noise correction circuit 18C in the following manner. That is, first, the series of operations of exposure, photoelectric conversion, signal charge storage, and signal charge reading-out (step S11 in the above-mentioned first embodiment) is performed in the photodiode 12A while controlling the transmittances of the chromic mirrors 14A and 14B in the same way as in the above-mentioned first embodiment. Then, when the output signal D0 from the photodiode 12A is input into the signal processing section 18, the signal processing section 18 performs the noise correcting process on the output signal D0 so input (step S220). Then, the series of operations of exposure, photoelectric conversion, signal charge storage, and signal charge reading-out (step S12 in the above-mentioned first embodiment) is performed in the photodiode 12B while controlling the transmittances of the chromic mirrors 14A and 14B in the same way as in the above-mentioned first embodiment. Then, when the output signal D0 from the photodiode 12B is input into the signal processing section 18, the signal processing section 18 performs the noise correcting process on the basis of the output signal D0 so input step S221). The series of these processing operations (steps S11, S220, S12, and S221) is repetitively performed until image picking-up is completed (Y in step S222).

Here, in the above-mentioned steps S220 and S221, the signal processing section 18 specifically performs such a correcting process as follows by the noise correction circuit 18C. That is, the signal processing section 18 measures noise components (noise components Dx1 and Dx2 for the pixels a1 and a2, respectively) in advance and holds the noise components Dx1 and Dx2 so measured. Then, correction that the noise component Dx1 (or the noise component Dx2) is subtracted from the output signal so input is performed. For example, correction that the noise component Dx1 is subtracted may be performed on the output signal D0 obtained from the pixel a1 and correction that the noise component Dx2 is subtracted may be performed on the output signal D0 obtained from the pixel a2. That is, a signal Dc obtained after correction is expressed by the following expression (3).

$$Dc=D0-Dx1 (\text{or } Rx2) \qquad (3)$$

Figure 30:
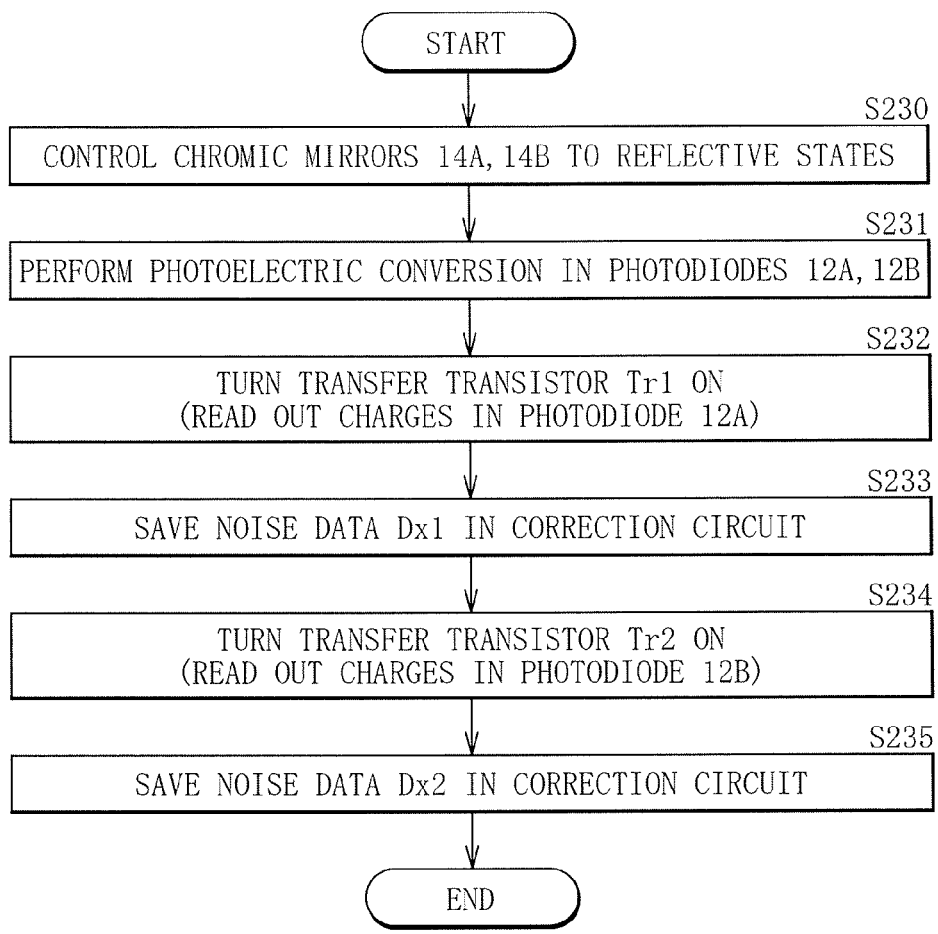
FIG. 30 is a flowchart illustrating one example of a noise data calculating operation used in the correcting operation by the signal processing section illustrated in FIG. 28.

In addition, the noise components Dx1 and Dx2 may be measured, for example, in the following manner. That is, first, both of the chromic mirrors 14A and 14B are controlled to the reflective states (step S230) as illustrated in FIG. 30. In this state, photoelectric conversion and signal charge storage are performed in the photodiodes 12A and 12B (step S231). Then, the transfer transistor Tr1 is turned ON (the transfer transistor Tr2 is turned OFF) and the signal is read out from the photodiode 12A (step S232). The signal that has been obtained from the photodiode 12A in a so-called dark state (a non-exposed state) as described above is saved as the noise component Dx1 (step S233). Then, the transfer transistor Tr2 is turned ON (the transfer transistor Tr1 is turned OFF) and the signal is read out from the photodiode 12B (step S234). The signal that has been obtained from the photodiode 12B in the so-called dark state (the non-exposed state) as described above is saved as the noise component Dx2 (step S235).

The signal processing section 18 may perform noise correction on the output signal D0 as in the present modification example, by which it is possible to implement the above-mentioned various functions (for example, the global shutter function and so forth) while reducing the influence of transfer noise and so forth.

<Modification Example 6-3>

Figure 31:
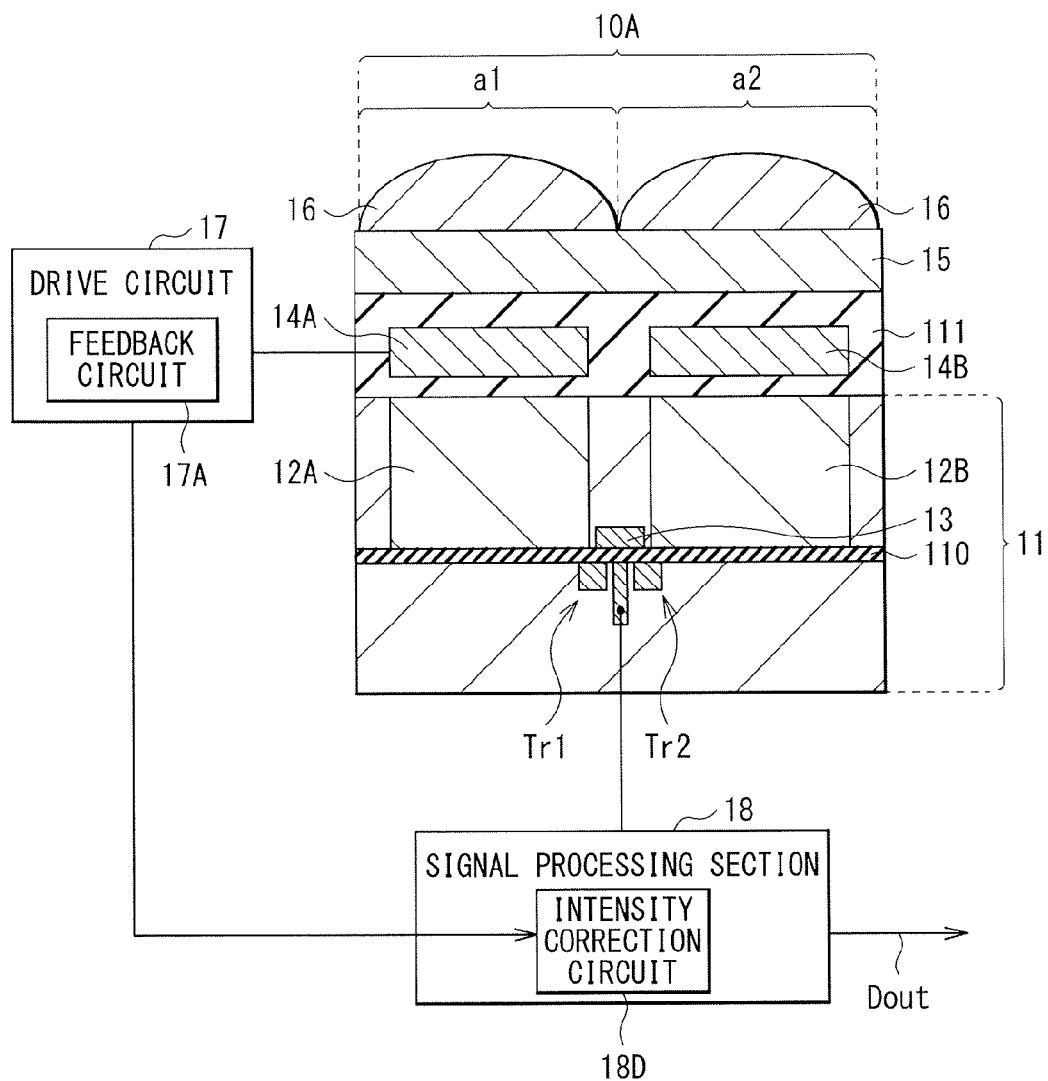
FIG. 31 is a sectional diagram illustrating one example of a configuration of main parts of a solid-state image pickup device that includes a signal processing section according to a modification example 6-3.

FIG. 31 illustrates one example of a configuration of main parts of a solid-state image pickup device according to the modification example 6-3. The solid-state image pickup device according to the present modification example may be configured by, for example, the CCD or CMOS image sensor and so forth in the same way as in the above-mentioned first embodiment and so forth. In the solid-state image pickup device according to the present modification example, the signal processing section 18 includes an intensity correction circuit 18D. In addition, in the present modification example, the chromic mirrors 14A and 14B are configured by the electrochromic elements as mentioned above and may be voltage-controlled, for example, by the drive circuit 17. A circuit (a feedback circuit 17A) adapted to feedback voltages applied to the chromic mirrors 14A and 14B to the intensity correction circuit 18D is formed in the drive circuit 17.

The intensity correction circuit 18D is a circuit section adapted to implement a so-called dynamic range expanding function by correcting the intensity of the signal on the basis of the output signal D0 (or a signal based on the output signal D0).

Figure 32:
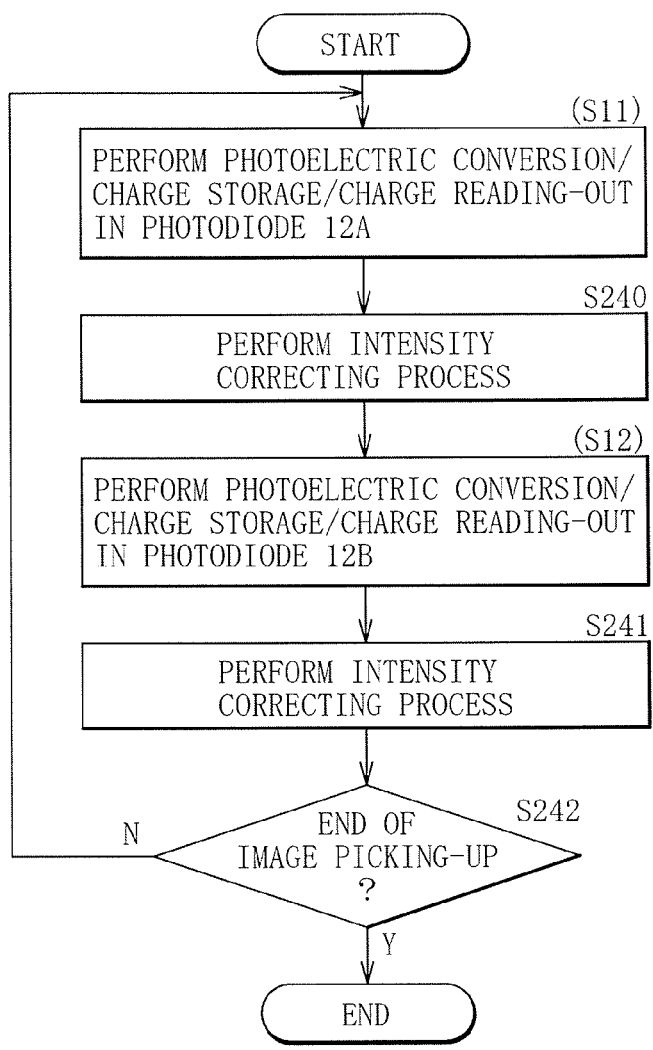
FIG. 32 is a flowchart for explaining one example of a correcting operation by the signal processing section illustrated in FIG. 31.

Specifically, the signal processing section 18 performs an intensity correcting process in the following manner by the intensity correction circuit 18D. That is, first, the series of operations of exposure, photoelectric conversion, signal charge storage, and signal charge reading-out (step S11 in the above-mentioned first embodiment) is performed in the photodiode 12A while controlling the transmittances of the chromic mirrors 14A and 14B in the same way as in the above-mentioned first embodiment as illustrated in FIG. 32. Then, when the output signal D0 from the photodiode 12A is input into the signal processing section 18, the signal processing section 18 performs the intensity correcting process on the output signal D0 so input (step S240). Then, the series of operations of exposure, photoelectric conversion, signal charge storage, and signal charge reading-out (step S12 in the above-mentioned first embodiment) is performed in the photodiode 12B while controlling the transmittances of the chromic mirrors 14A and 14B in the same way as in the above-mentioned first embodiment. Then, when the output signal D0 from the photodiode 12B is input into the signal processing section 18, the signal processing section 18 performs the intensity correcting process on the basis of the output signal D0 so input (step S241). The series of these processing operations (steps S11, S240, S12, and S241) is repetitively performed until image picking-up is completed (Y in step S242).

Figure 33A:
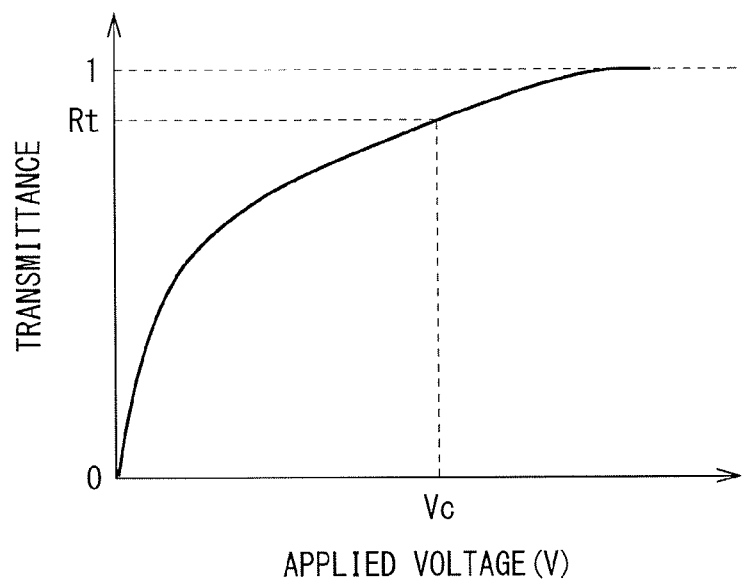
FIG. 33A is one example of data on transmittance-voltage characteristics that the signal processing section illustrated in FIG. 31 holds.

Here, in the above-mentioned steps S240 and S241, the signal processing section 18 performs a correcting process as follows by the intensity correction circuit 18D. That is, the signal processing section 18 holds in advance data (hereinafter, referred to as voltage/transmittance data) on a relation of the transmittance with the voltage applied to each of the chromic mirrors 14A and 14B. FIG. 33A illustrates one example of the voltage/transmittance data.

Figure 33B:
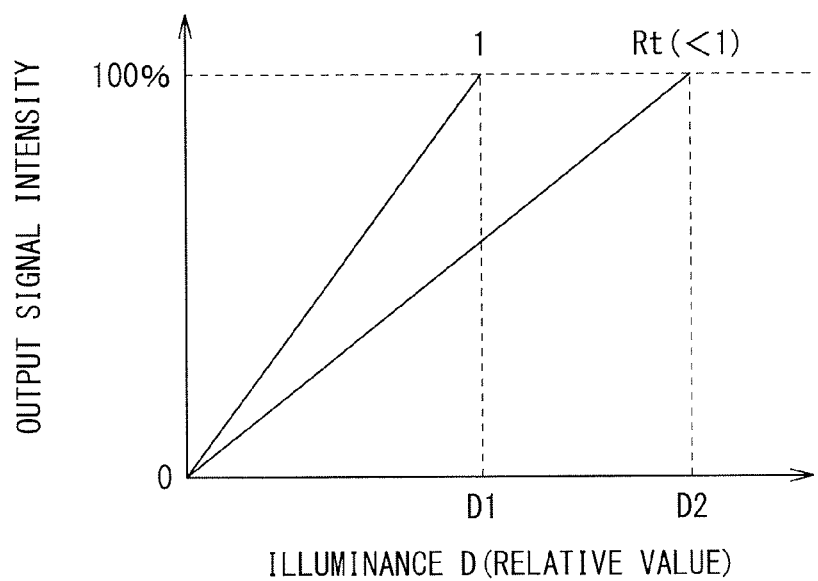
FIG. 33B is an explanatory schematic diagram illustrating one example of an intensity correction effect (dynamic range expansion) brought about by the correcting operation by the signal processing section illustrated in FIG. 31.

In the present modification example, an applied voltage Vc to each of the chromic mirrors 14A and 14B (a voltage to be applied when the chromic mirror concerned is to be controlled to the transmissive state) may be manually set in advance by an external input signal (a user input and so forth) such that, for example, each of the chromic mirrors 14A and 14B enters a semi-transmissive state (a state that the transmittance does not reach 1). Alternatively, the applied voltage Vc may be automatically optimized (described later) so as to be a marginal voltage (or a near-marginal voltage) at which light saturation occurs in each of the photodiodes 12A and 12B. In either case, the dynamic range (an illuminance D) is extended from D1 to D2 as illustrated in FIG. 33B by specifying a value (<1) of the effective transmittance Rt from a value of the applied voltage Vc using the above-mentioned voltage/transmittance data. That is, the signal processing section 18 performs intensity correction by a correction arithmetic operation expressed by the following expression (4). However, it is assumed that I is an intensity of the output signal and Id is a signal intensity after correction.

$$Id=I \times (1/Rt) \qquad (4)$$

Figure 34:
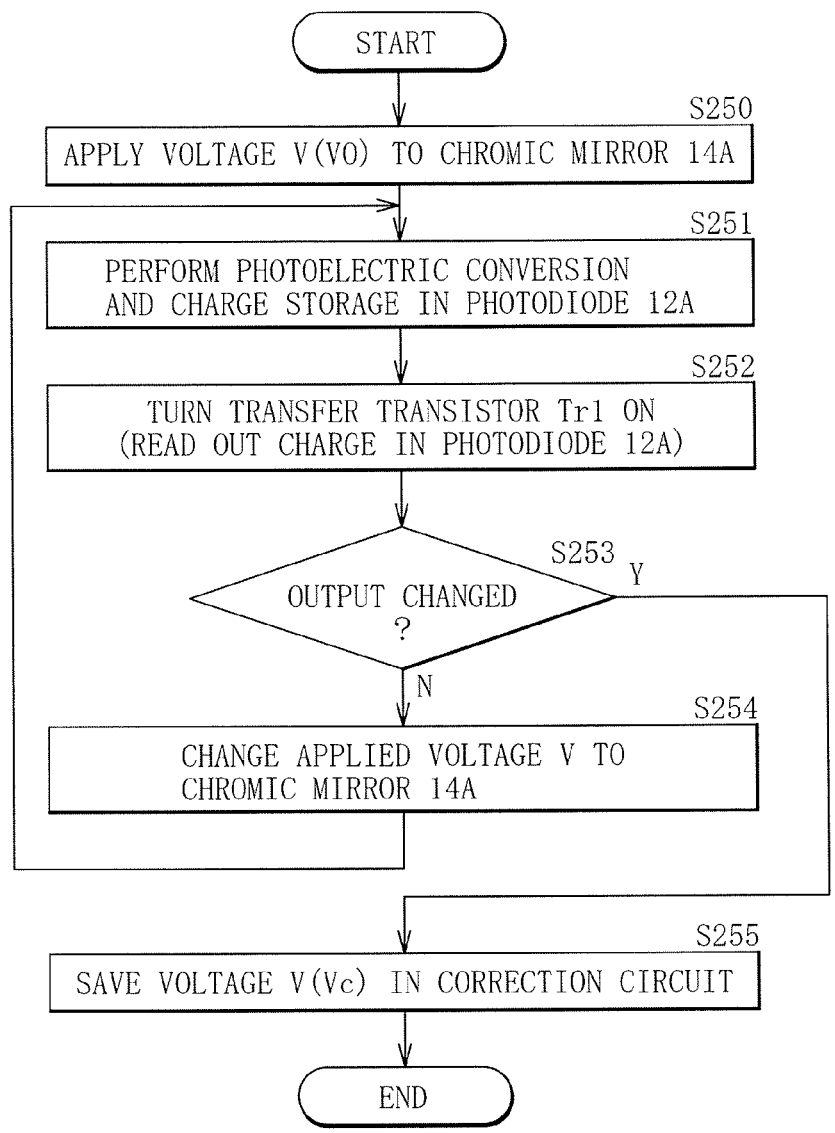
FIG. 34 is a flowchart for explaining one example of an optimum applied voltage calculating operation used in the correcting operation by the signal processing section illustrated in FIG. 31.

FIG. 34 is a flowchart illustrating one example of an operation of automatically setting the applied voltage Vc. In this case, a signal is read out from one (here, the pixel a1 is given by way of example) of the pixels in the pixel pair 10A while changing a voltage V to be applied to the chromic mirror 14A and a marginal voltage value that light saturation occurs in the photodiode 12A is measured. Specifically, first, the voltage V (an initial voltage V0) is applied to the chromic mirror 14A to control it to the transmissive state (step S250). At that time, the chromic mirror 14B is controlled to the reflective state. It is to be noted that although there is no particular limitation on the initial voltage V0, for example, it may be set to such a voltage as follows. That is, a voltage at which "1" is attained as the transmittance is set as a reference voltage and the voltage V to be applied to the chromic mirror 14A is stepwise changed such that the transmittance is stepwise lowered from the reference voltage (later described step S254). Specifically, the value of the voltage V may be stepwise (for example, by 0.1 V each time) changed such that the transmittance is stepwise lowered from 1 to Rt0, then to Rt1, . . . , and down to Rt (the marginal transmittance for light saturation) (1>Rt0>Rt1> . . . , >Rt). For example, a voltage (a voltage lower than the reference voltage by one step) at which the transmittance Rt0 is obtained may be selected as the voltage V0.

Thus, exposure, photoelectric conversion, and signal charge storage are performed in the photodiode 12A (step S251). Thereafter, the output signal D0 is read out from the photodiode 12A by turning the transfer transistor Tr1 ON (step S252). An output corresponding to the transmittance Rt0 and the voltage V0 is obtained in this way. Then, it is determined whether a change occurs in the obtained output (step S253). Specifically, the output corresponding to the transmittance Rt0 and the voltage V0 is compared with the output corresponding to the reference voltage for the above-mentioned transmittance 1 and whether the change occurs is determined from a relation between a difference between the outputs and a threshold value. As a result, when no change occurs in the output (N in step S253), the voltage V to be applied to the chromic mirror 14A is changed to the value as mentioned above (step S254). Then, signal reading-out (step S252) and determination on the change in output (step S253) are again performed returning to the above-mentioned step S251. As a result, when the change has occurred in the output (Y in step S253), the voltage V that has been applied to the chromic mirror 14A at that time is saved as an optimum value (the applied voltage Vc) (step S255). The above-mentioned applied voltage Vc may be set in this way. It is to be noted that such setting of the applied voltage Vc may be also performed after image picking-up has been started, not limited to before performing the image picking-up, and may be performed a plurality of times, not limited to one time.

The signal processing section 18 may perform intensity correction on the output signal D0 as in the present modification example. Thus, it is possible to implement the above-mentioned various functions (for example, the global shutter function and so forth) while expanding the dynamic range. When intensity correction is utilized for the W pixel in particular, it is possible to greatly reduce the noise.

Modification Example 6-4

Figure 35:
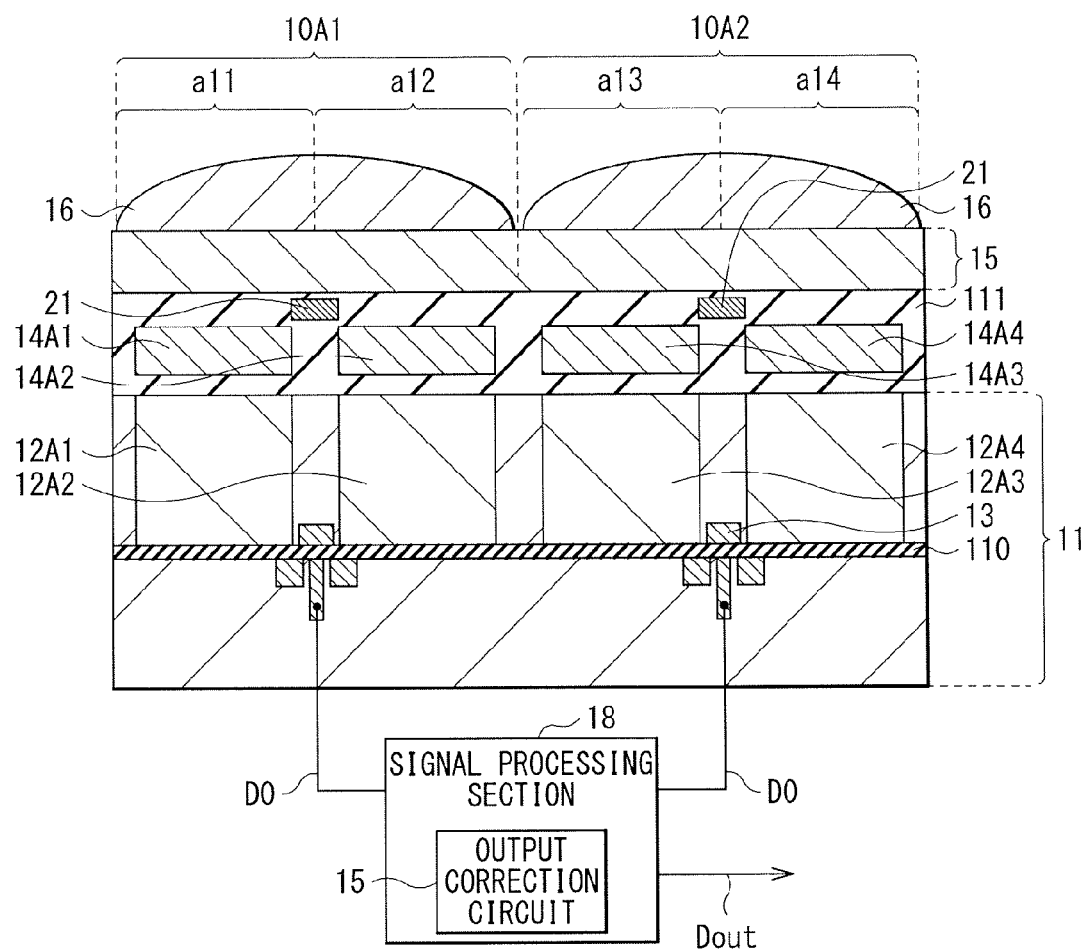
FIG. 35 is a sectional diagram illustrating one example of a configuration of main parts of a solid-state image pickup device that includes a signal processing section according to a modification example 6-4.

FIG. 35 illustrates one example of a configuration of main parts of a solid-state image pickup device according to the modification example 6-4. The solid-state image pickup device according to the present modification example may be configured by, for example, the CCD or CMOS image sensor and so forth in the same way as in the above-mentioned first embodiment and so forth. Since the solid-state image pickup device according to the present modification example works effectively, in particular, in the pixel structure of the above-mentioned third embodiment, description will be made by giving the configuration of the pixel pairs 10A1 and 10A2 in the above-mentioned third embodiment by way of example. The signal processing section 18 to be connected to the pixel pairs 10A1 and 10A2 includes an output correction circuit 18E. In addition, the light shielding films 21 are disposed between the pixels a11 and a12 and between the pixels a13 and a14 in the pixel pairs 10A1 and 10A2.

Figure 36:
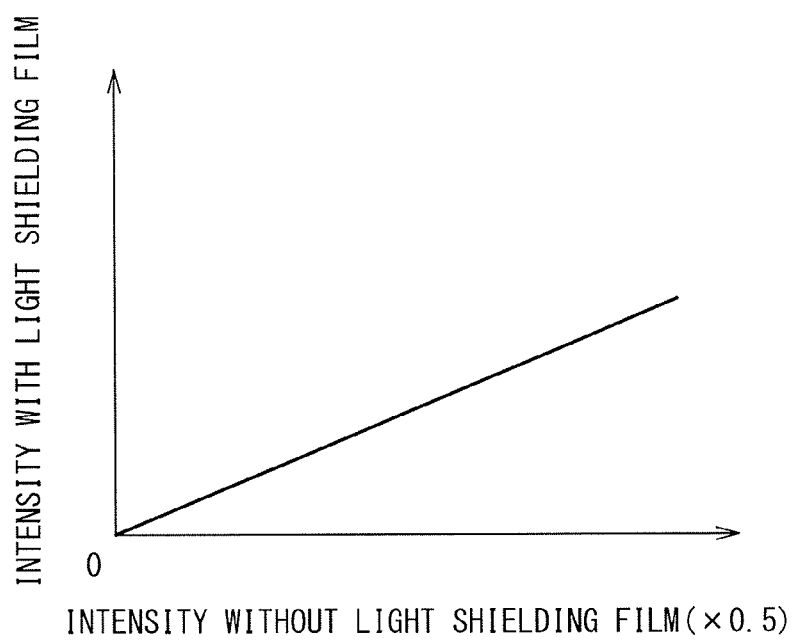
FIG. 36 is one example of data indicating a correspondence relation in intensity between a case including a light shielding film and a case not including the light shielding film that the signal processing section illustrated in FIG. 35 holds.

The output correction circuit 18E is a circuit section adapted to perform correction in order to compensate for attenuation in light amount by the light shielding film 21 on the basis of the output signal D0. Although the light shielding films 21 for shielding the FDs 13, the transfer transistors Tr1 and Tr2 and so forth are disposed between the pixels a11 and a12 and between the pixels a13 and a14, rays of the incident light upon the photodiodes 12A1 to 12A4 are restricted due to the presence of these light shielding films 21 and light amount attenuation occurs. Therefore, data on light amount correlation (a characteristic diagram illustrating the correlation between the light amounts in the presence of the light shielding film and the absence of the light shielding film), for example, illustrated in FIG. 36 may be held in advance and the output signal D0 may be corrected by using this data.

The signal processing section 18 may perform correction that the presence of the light shielding film 21 is taken into account on the output signal D0 in this way. Thus, it is possible to implement the above-mentioned various functions (for example, the global shutter function and so forth) while restricting the light amount attenuation.

Modification Example 7

Figure 37:
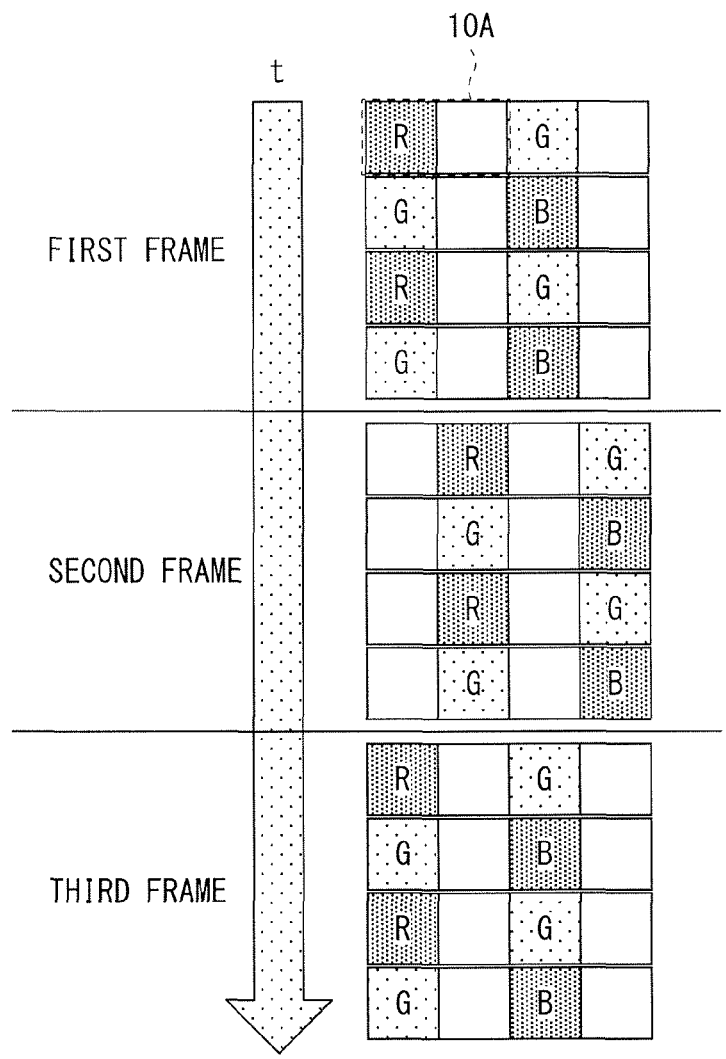
FIG. 37 is an explanatory schematic diagram illustrating one example of a driving operation (a parallax image acquiring operation) by a solid-state image pickup device according to a modification example 7.

FIG. 37 is a schematic diagram for explaining one example of a driving operation (a parallax image acquiring operation) of a solid-state image pickup device according to the modification example 7. Although the signals are alternately read out from the pixels a1 and a2 in the pixel pair 10A in the solid-state image pickup devices according to the above-mentioned first embodiment and so forth, it is also possible to acquire, for example, right and left parallax images for a stereoscopic vision by performing driving for signal reading-out as mentioned above. In this case, for example, an image signal may be generated on the basis of output signals that have been temporally continuously acquired from the pixels a1 and a2. Specifically, an image based on the output signal from the pixel a1 is generated in a first frame and then an image based on the output signal from the pixel a2 is generated in a second frame as illustrated in FIG. 37. Since a minute parallax is generated due to a difference in position between the pixels a1 and a2 in the pixel pair 10A as mentioned, it is also possible to generate the parallax images. Then, the right and left parallax images are alternately generated in a third frame, a fourth frame, . . . , and so forth in the same way.

<General Configuration of Solid-State Image Pickup Device>

Figure 38:
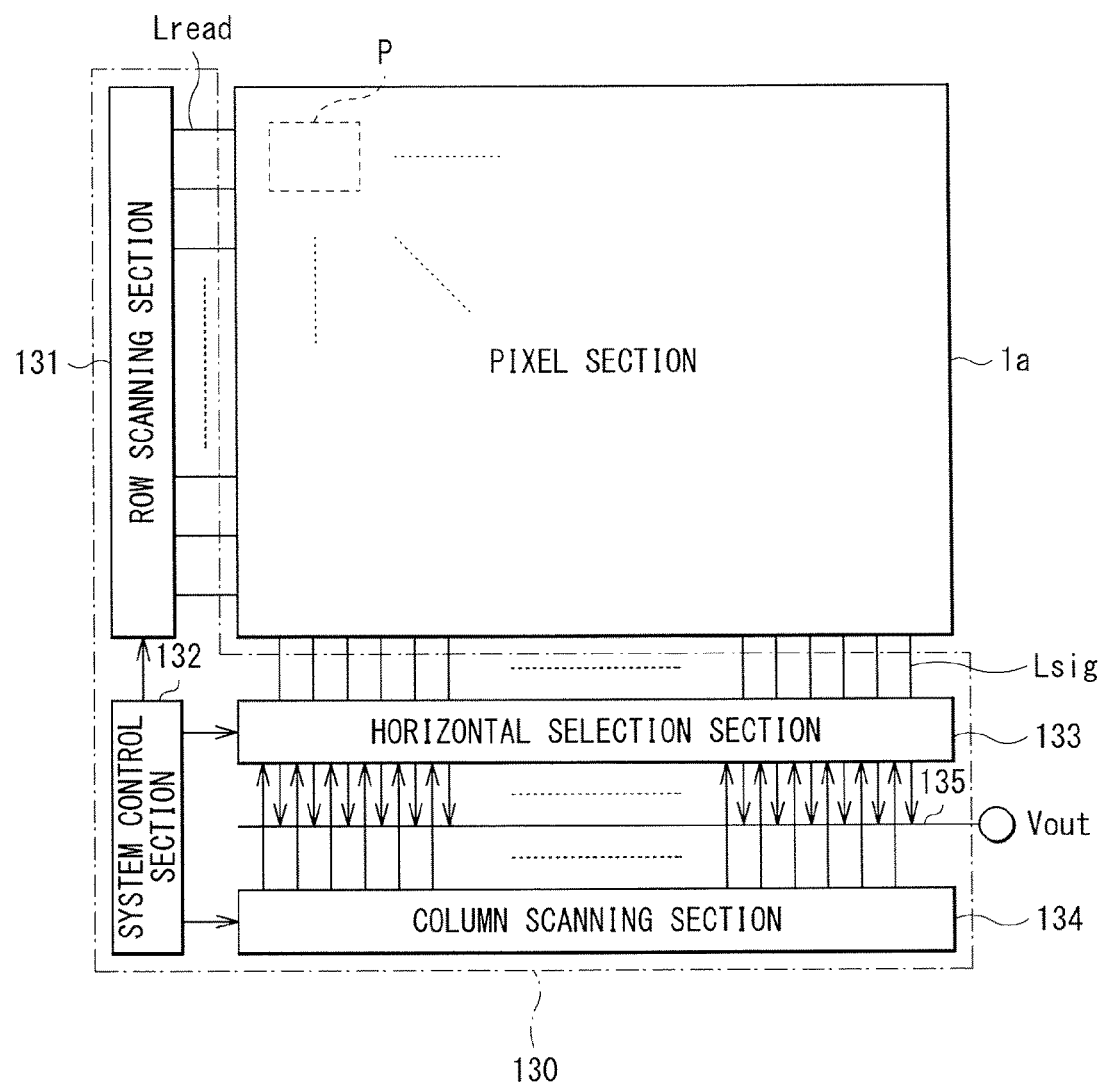
FIG. 38 is a functional block diagram illustrating one example of the solid-state image pickup device.

FIG. 38 is a functional block diagram illustrating one example of the general configuration of the solid-state image pickup device described in each of the above-mentioned embodiments. This solid-state image pickup device may be configured by, for example, the CMOS image sensor, and includes the pixel section 1a as the image pickup pixel region, and may also include a circuit section 130 including, for example, a row scanning section 131, a horizontal selection section 133, a column scanning section 134, and a system control section 132. The circuit section 130 may be either disposed in a peripheral region of the pixel section 1a or disposed (in a region facing the pixel section 1a) by being laminated with the pixel section 1a. It is to be noted that a part of the circuit section 130 corresponds to a part or the entire of the signal processing section 18 in the above mentioned embodiments and so forth.

The pixel section 1a may include a plurality of unit pixels (pixels P) (corresponding to the above-mentioned pixels a1, a2, or a11 to a14) that are arranged, for example, two-dimensionally in a matrix. A pixel drive line Lread (specifically, a row selection line and a reset control line) may be wired to the pixel P, for example, for every pixel row and a vertical signal line Lsig may be wired to the pixel P for every pixel column. The pixel drive line Lread is adapted to transfer a drive signal used for signal reading-out from each pixel. One end of the pixel drive line Lread is connected to an output end corresponding to each row of the row scanning section 131.

The row scanning section 131 is a pixel drive section configured by a shift register, an address recorder or the like and adapted to drive each pixel P in the pixel section 1a, for example, on a row-by-row basis. Each signal output from each pixel P in a pixel row that has been selectively scanned by the row scanning section 131 is supplied to the horizontal selection section 133 through each vertical signal line Lsig. The horizontal selection section 133 is configured by an amplifier, a horizontal switch and so forth disposed for every vertical signal line Lsig.

The column scanning section 134 is configured by a shift register, an address decoder and so forth and adapted to drive in order respective horizontal switches of the horizontal selection section 133 while performing scanning. The signals from the respective pixels that are transferred through the respective vertical signal lines Lsig are transferred in order to horizontal signal lines 135 by selective scanning performed by the row scanning section 134 and are output through the horizontal signal lines 135 concerned.

The system control section 132 is adapted to receive a clock signal supplied from the outside and data for instructing an operation mode, and to output data on internal information and so forth of the solid-state image pickup device 1. In addition, the system control section 132 includes timing generators for generating various timing signals and controls driving of the row scanning section 131, the horizontal selection section 133, and the column scanning section 134 and so forth on the basis of the various timing signals generated by the timing generators concerned.

Application Example

Figure 39:
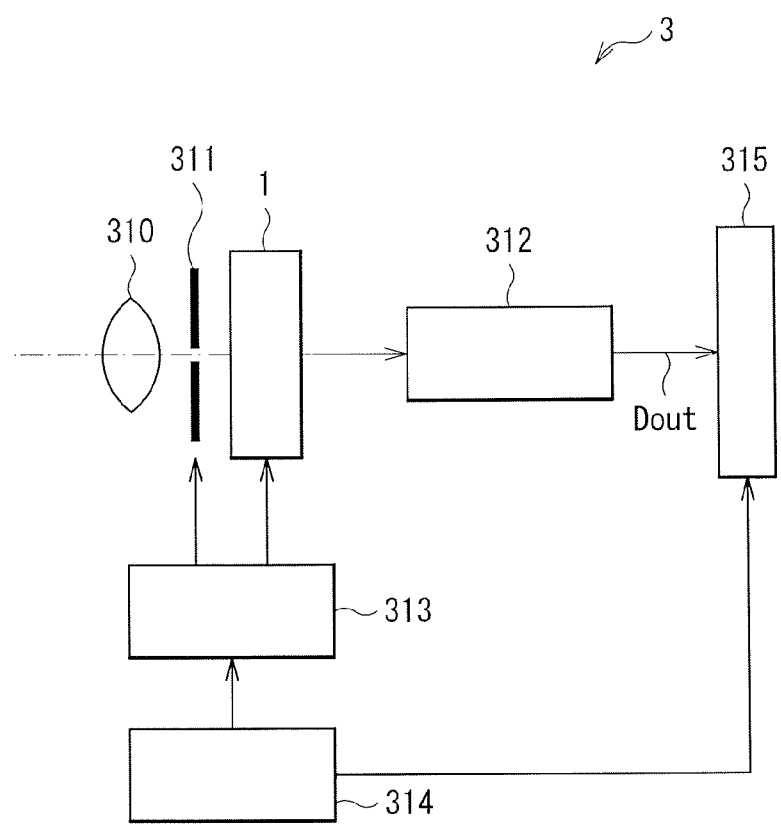
FIG. 39 is a functional block diagram illustrating one example of an electronic apparatus according to one application example.

The solid-state image pickup device according to any of the above-mentioned embodiments and so forth may be applied to all types of electronic apparatus having the image picking-up function including, for example, camera systems such as a digital camera, video camera and so forth, and mobile phones and so forth having the image picking-up function. FIG. 39 illustrates a schematic configuration of an electronic apparatus 2 (a camera) as one example thereof. The electronic apparatus 2 may be, for example, a video camera adapted to take a still image or capture a moving image and may include, for example, the solid-state image pickup device 1 (corresponding to the solid-state image pickup device according to any of the above-mentioned embodiments and so forth), an optical system (an image pickup lens) 310, a shutter device 311, a drive section 313 (including the above-mentioned circuit section 130) adapted to drive the solid-state image pickup device 1 and the shutter device 311, a signal processing section 312 (including the above-mentioned signal processing section 18), a user interface 314, and a monitor 315.

The optical system 310 is adapted to guide image light (incident light) from an object to the pixel section 1a of the solid-state image pickup device 1. This optical system 310 may be configured by a plurality of optical lenses. The shutter device 311 is adapted to control a light application period and a light shielding period for the solid-state image pickup device 1. The drive section 313 is adapted to control a transfer operation of the solid-state image pickup device 1 and a shutter operation of the shutter device 311. The signal processing section 312 is adapted to perform various kinds of signal processing on the signal output from the solid-state image pickup device 1. An image signal Dout after subjected to the signal processing is output onto the monitor 315. Alternatively, the image signal Dout may be stored in a memory medium such as a memory and so forth. In the user interface 314, designation of a photographing scene (designation of the dynamic range, designation of the wavelength of light (terahertz rays, visible rays, infrared rays, ultraviolet rays, X-rays and so forth)) and so forth are possible, and the designation (an input signal input through the user interface 314) is sent to the drive section 313 and desired image picking-up is performed by the solid-state image pickup device 1 on the basis of the input signal.

Examples of such a camera as mentioned above may include a digital single-lens reflex camera. In the digital single-lens reflex camera, reflected light generated at the chromic mirrors according to any of the above-mentioned embodiments and so forth may be supplied to a pentagonal prism to utilize the chromic mirrors as an auxiliary monitor for photography. In the above-mentioned case, the chromic mirrors may be formed on an insulating film layer so inclined as to irradiate the pentagonal prism with light.

Although description has been made by giving the example embodiments, the modification examples and the application example thereof as mentioned above, the contents of the present disclosure are not limited to the above-mentioned embodiments and so forth and may be modified in a variety of ways. For example, although a case that the pixel pair includes two pixels that detect the same wavelength has been exemplified in the above-mentioned embodiments and so forth, the pixels included in the pixel pair do not necessarily have be of the type of detecting the same wavelength. For example, it is also possible to implement various functions as mentioned above even by grouping pixels that detect mutually different wavelengths as one pixel pair, as long as it is possible to perform an appropriate color correcting process on the output signals by the signal processing section.

In addition, although a case that the solid-state image pickup device is applied to the camera has been exemplified in the above-mentioned embodiments and so forth, it is possible to use this solid-state image pickup device in an electronic apparatus in general that performs imaging of light (electromagnetic waves) such as, for example, an endoscope, a vision chip (a retinal prosthesis), a biosensor and so forth. There are also cases when a body temperature is converted into a voltage by a thermo-electric device to be used as the voltage to be applied to the chromic mirror in case of a wearable sensor.

Although description has been made by giving the backside illumination type solid-state image pickup device by way of example in the above-mentioned embodiments and so forth, the contents of the present disclosure are also applicable to a front-side illumination type solid-state image pickup device.

In addition, it is not necessary to include all the constitutional elements described in the above-mentioned embodiments and so forth in the solid-state image pickup device according to any of the embodiments of the present disclosure, and rather an element or elements other than the above-mentioned elements may be also included.

Furthermore, the technology encompasses any possible combination of some or all of the various embodiments described herein and incorporated herein.

It is possible to achieve at least the following configurations from the above-described example embodiments of the disclosure.

(1) A solid-state image pickup device, including:
a plurality of pixels each including a photoelectric conversion element; and
a transmittance control element provided on a light incident side of the photoelectric conversion element of at least a part of the plurality of pixels, and configured to change a transmittance of incident light by an external input.
(2) The solid-state image pickup device according to (1), wherein the plurality of pixels include one or more pixel pairs each including a first pixel and a second pixel, the first pixel and the second pixel being configured to detect same wavelength as one another, and being provided adjacent to one another.
(3) The solid-state image pickup device according to (2), wherein the one or more pixel pairs each include a floating diffusion that is shared between the first pixel and the second pixel.
(4) The solid-state image pickup device according to (2) or (3), wherein the transmittance control element is provided to face an entire region of a light receiving surface of the photoelectric conversion element, for each of the pixels.
(5) The solid-state image pickup device according to (2) or (3), wherein the transmittance control element is provided to face a part of a light receiving surface of the photoelectric conversion element, for each of the first pixel and the second pixel included in the one or more pixel pairs.
(6) The solid-state image pickup device according to (5), wherein the transmittance control elements are disposed to form a gap in the one or each of the pixel pairs.
(7) The solid-state image pickup device according to (4), further including an on-chip lens provided on a light incident side of the transmittance control element and striding over the first pixel and the second pixel of the one or more pixel pairs,
wherein the two pixel pairs that detect the same wavelength as one another are disposed adjacent to each other.
(8) The solid-state image pickup device according to any one of (1) to (7), wherein the transmittance control element is one of an electrochromic element, a thermochromic element, a photochromic element, and a gasochromic element.
(9) The solid-state image pickup device according to any one of (1) to (8), further including a signal processing section configured to perform signal processing on an output signal obtained from the plurality of pixels, the signal processing section being configured to perform, on the output signal, a correcting process in which the transmittance and a reflectance of the transmittance control element are taken into account.
(10) The solid-state image pickup device according to any one of (1) to (9), further including a signal processing section configured to perform signal processing on an output signal obtained from the plurality of pixels, the signal processing section being configured to perform a noise correcting process on the output signal.
(11) The solid-state image pickup device according to any one of (1) to (10), further including a signal processing section configured to perform signal processing on an output signal obtained from the plurality of pixels, the signal processing section being configured to perform an intensity correcting process on the output signal.
(12) The solid-state image pickup device according to (7), further including a signal processing section configured to perform signal processing on an output signal obtained from the plurality of pixels, the signal processing section being configured to perform, on the output signal, a correcting process in which a light-shielding film disposed between the first pixel and the second pixel is taken into account.
(13) A method of driving solid-state image pickup device, the method including:
driving a transmittance control element provided on a light incident side of a photoelectric conversion element in at least a part of a plurality of pixels each including the photoelectric conversion element, the transmittance control element being configured to change a transmittance of incident light; and
reading out an output signal from the plurality of pixels while controlling the transmittance by driving the transmittance control element.
(14) The method of driving solid-state image pickup device according to (13), wherein
the plurality of pixels include one or more pixel pairs each including a first pixel and a second pixel, the first pixel and the second pixel being configured to detect same wavelength as one another, and being provided adjacent to one another, and
the reading out the output signal is performed on the first pixel and the second pixel sequentially or alternately using a floating diffusion that is shared between the first pixel and the second pixel.
(15) The method of driving solid-state image pickup device according to (14), further including performing a first image picking-up operation,
wherein the transmittance control element is provided to face an entire region of a light receiving surface of the photoelectric conversion element, for each of the pixels, and
wherein the performing the first image picking-up operation includes:
exposing the first pixel to light while controlling the transmittance control element in the first pixel to a transmissive state and the transmittance control element in the second pixel to a reflective state in the one or more pixel pairs;
storing a charge into the first pixel while controlling the transmittance control element of each of the first pixel and the second pixel to the reflective state after the first pixel has been exposed to the light;
exposing the second pixel to the light by controlling the transmittance control element in the second pixel to the transmissive state upon reading out the charge stored in the first pixel as the output signal;
storing a charge into the second pixel while controlling the transmittance control element of each of the first pixel and the second pixel to the reflective state after the second pixel has been exposed to the light; and exposing the first pixel to the light by controlling the transmittance control element in the first pixel to the transmissive state upon reading out the charge stored in the second pixel as the output signal.

(16) The method of driving solid-state image pickup device according to (14), further including performing a focusing operation and performing a second image picking-up operation, wherein the transmittance control element is provided to face a part of a light receiving surface of the photoelectric conversion element, for each of the first pixel and the second pixel included in the one or more pixel pairs, wherein the performing the focusing operation includes:

reading out the output signal from each of the first pixel and the second pixel while controlling the transmittance control element of each of the first pixel and the second pixel to a reflective state in the one or more pixel pairs;

detecting a phase difference between the first pixel and the second pixel on the basis of the output signals read out from the first pixel and the second pixel; and determining in-focus or out-of-focus by comparing the detected phase difference with a reference phase difference that has been retained in advance, and wherein the performing the second image picking-up operation includes reading out the output signal from each of the first pixel and the second pixel while controlling the transmittance control element of each of the first pixel and the second pixel to a transmissive state in the one or more pixel pairs.

(17) The method of driving solid-state image pickup device according to (16), wherein the performing the focusing operation includes:

moving on to the second image picking-up operation when the in-focus is determined; and performing again the determining the in-focus or the out-of-focus when the out-of-focus is determined, by sequentially performing shifting a lens position, the reading out the output signal, the detecting the phase difference, and the comparing the detected phase difference.

(18) The method of driving solid-state image pickup device according to (15), further including performing a focusing operation, wherein an on-chip lens striding over the first pixel and the second pixel is provided on a light incident side of the transmittance control element of the one or more pixel pairs, and the two pixel pairs that detect the same wavelength as one another are disposed adjacent to each other, wherein the first image picking-up operation is performed on each of the pixel pairs, and wherein the performing the focusing operation includes:

reading out, for each of the two pixel pairs, the output signal from each of the pixel pairs while controlling the transmittance control element of one of the first pixel and the second pixel to the reflective state and the transmittance control element of the other to the transmissive state;

detecting a phase difference between the two pixel pairs on the basis of the read-out output signals; and determining in-focus or out-of-focus by comparing the detected phase difference with a reference phase difference that has been retained in advance.

(19) The method of driving solid-state image pickup device according to (14), further including generating a right parallax image and a left parallax image for a stereoscopic vision on the basis of the output signal obtained continuously in time from each of the first pixel and the second pixel.

(20) An electronic apparatus provided with a solid-state image pickup device, the solid-state image pickup device including:

a plurality of pixels each including a photoelectric conversion element; and a transmittance control element provided on a light incident side of the photoelectric conversion element of at least a part of the plurality of pixels, and configured to change a transmittance of incident light by an external input.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device, comprising:
a plurality of pixels,
wherein each pixel of the plurality of pixels includes a photodiode,
wherein the plurality of pixels include one or more pixel pairs and each of the one or more pixel pairs includes a first pixel and a second pixel,
wherein the first pixel and the second pixel are configured to detect a same wavelength as one another, and are provided adjacent to one another; and
a chromic mirror provided on a light incident side of the photodiode of at least a part of the plurality of pixels, and configured to change a transmittance of incident light by an external input,
wherein the chromic mirror is configured to face an entire region of a light receiving surface of the photodiode, for each of the plurality of pixels,
wherein each of the one or more pixel pairs includes a floating diffusion that is shared between the first pixel and the second pixel,
and
wherein the solid-state image pickup device is configured to:
read out an output signal from the plurality of pixels while the transmittance is controlled by the chromic mirror, wherein the output signal is read out from the first pixel and the second pixel sequentially or alternately by use of the floating diffusion,
expose the first pixel to the incident light while the chromic mirror in the first pixel is controlled to a transmissive state and the chromic mirror in the second pixel is controlled to a reflective state in the one or more pixel pairs,
store a charge into the first pixel while the chromic mirror in the first pixel and the chromic mirror in the second pixel are controlled to the reflective state after the exposure of the first pixel to the incident light,
expose the second pixel to the incident light by control of the chromic mirror in the second pixel to the transmissive state upon the read out of the charge stored in the first pixel as the output signal,
store a charge into the second pixel while the chromic mirror in the first pixel and the chromic mirror in the second pixel are controlled to the reflective state after the exposure of the second pixel to the incident light, and
expose the first pixel to the incident light by control of the chromic mirror in the first pixel to the transmissive state upon the read out of the charge stored in the second pixel as the output signal.

2. The solid-state image pickup device according to claim 1, wherein the chromic mirror is provided to face a part of a light receiving surface of the photodiode, for each of the first pixel and the second pixel included in the one or more pixel pairs.

3. The solid-state image pickup device according to claim 2, wherein a gap is in between the chromic mirror of the first pixel and the chromic mirror of the second pixel.

4. The solid-state image pickup device according to claim 1, further comprising an on-chip lens provided on a light incident side of the chromic mirror and striding over the first pixel and the second pixel of the one or more pixel pairs,
wherein two pixel pairs, of the one or more pixel pairs, that detect the same wavelength as one another are adjacent to each other.

5. The solid-state image pickup device according to claim 4, further comprising a signal processing section configured to process the output signal obtained from the plurality of pixels, the signal processing section being configured to correct the output signal based on a light-shielding film between the first pixel and the second pixel.

6. The solid-state image pickup device according to claim 1, wherein the chromic mirror is configured to change the transmittance based on one of a gas reaction, a voltage, a temperature, or the incident light.

7. The solid-state image pickup device according to claim 1, further comprising a signal processing section configured to process the output signal obtained from the plurality of pixels, the signal processing section being configured to correct the output signal based on the transmittance and a reflectance of the chromic mirror.

8. The solid-state image pickup device according to claim 1, further comprising a signal processing section configured to process the output signal obtained from the plurality of pixels, the signal processing section being configured to correct noise of the output signal.

9. The solid-state image pickup device according to claim 1, further comprising a signal processing section configured to process the output signal obtained from the plurality of pixels, the signal processing section being configured to correct intensity of the output signal.

10. A method of driving a solid-state image pickup device, comprising:
driving a chromic mirror provided on a light incident side of a photodiode in at least a part of a plurality of pixels each including the photodiode,
wherein the chromic mirror is configured to change a transmittance of incident light,
wherein the plurality of pixels include one or more pixel pairs and each of the one or more pixel pairs includes a first pixel and a second pixel,
wherein the first pixel and the second pixel are configured to detect a same wavelength as one another, and being provided adjacent to one another; and
reading out an output signal from the plurality of pixels while controlling the transmittance by driving the chromic mirror,
wherein the output signal is read out from the first pixel and the second pixel sequentially or alternately using a floating diffusion that is shared between the first pixel and the second pixel,
wherein the chromic mirror is provided to face an entire region of a light receiving surface of the photodiode, for each of the plurality of pixels, and
wherein a first image picking-up operation by the solid-state image pickup device includes:
exposing the first pixel to the incident light while controlling the chromic mirror in the first pixel to a transmissive state and the chromic mirror in the second pixel to a reflective state in the one or more pixel pairs,
storing a charge into the first pixel while controlling the chromic mirror in the first pixel and the chromic mirror in the second pixel to the reflective state after the first pixel has been exposed to the incident light,
exposing the second pixel to the incident light by controlling the chromic mirror in the second pixel to the transmissive state upon reading out the charge stored in the first pixel as the output signal,
storing a charge into the second pixel while controlling the chromic mirror of each of the first pixel and the second pixel to the reflective state after the second pixel has been exposed to the incident light, and
exposing the first pixel to the incident light by controlling the chromic mirror in the first pixel to the transmissive state upon reading out the charge stored in the second pixel as the output signal.

11. The method of driving the solid-state image pickup device according to claim 10, further comprising a focusing operation and a second image picking-up operation,
wherein the chromic mirror is provided to face a part of the light receiving surface of the photodiode, for each of the first pixel and the second pixel included in the one or more pixel pairs,
wherein the focusing operation includes:
reading out the output signal from each of the first pixel and the second pixel while controlling the chromic mirror of each of the first pixel and the second pixel to the reflective state in the one or more pixel pairs;
detecting a phase difference between the first pixel and the second pixel on the basis of the output signal read out from the first pixel and the second pixel; and
determining in-focus or out-of-focus by comparing the detected phase difference with a reference phase difference that has been retained in advance, and
wherein the second image picking-up operation includes reading out the output signal from each of the first pixel and the second pixel while controlling the chromic mirror of each of the first pixel and the second pixel to the transmissive state in the one or more pixel pairs.

12. The method of driving the solid-state image pickup device according to claim 11, wherein the focusing operation includes:
moving on to the second image picking-up operation based on the determination of the in-focus; and
determining the in-focus or the out-of-focus based on the determination of the out-of-focus, by sequentially shifting a lens position, the reading out the output signal, the detecting the phase difference, and the comparing the detected phase difference.

13. The method of driving the solid-state image pickup device according to claim 10, further comprising a focusing operation,
wherein an on-chip lens striding over the first pixel and the second pixel is provided on a light incident side of the chromic mirror of the one or more pixel pairs, and two pixel pairs of the one or more pixel pairs that detect the same wavelength as one another are adjacent to each other,
wherein each of the one or more pixel pairs are configured for the first image picking-up operation, and wherein the focusing operation includes:
reading out, for each of the two pixel pairs, the output signal from each of the two pixel pairs while controlling the chromic mirror of one of the first pixel and the second pixel to the reflective state and the chromic mirror of the other pixel to the transmissive state;
detecting a phase difference between the two pixel pairs on the basis of the read-out output signal; and
determining in-focus or out-of-focus by comparing the detected phase difference with a reference phase difference that has been retained in advance.

14. The method of driving the solid-state image pickup device according to claim 10, further comprising generating a right parallax image and a left parallax image for a stereoscopic vision on the basis of the output signal obtained continuously in time from each of the first pixel and the second pixel.

15. An electronic apparatus, comprising a solid-state image pickup device,
wherein the solid-state image pickup device comprises:
a plurality of pixels,
wherein each pixel of the plurality of pixels includes a photodiode,
wherein the plurality of pixels include one or more pixel pairs and each of the one or more pixel pairs includes a first pixel and a second pixel,
wherein the first pixel and the second pixel are configured to detect a same wavelength as one another, and are provided adjacent to one another; and
a chromic mirror provided on a light incident side of the photodiode of at least a part of the plurality of pixels, and configured to change a transmittance of incident light by an external input,
wherein the chromic mirror is configured to face an entire region of a light receiving surface of the photodiode, for each of the plurality of pixels,
wherein each of the one or more pixel pairs includes a floating diffusion that is shared between the first pixel and the second pixel,
and
wherein the solid-state image pickup device is configured to:
read out an output signal from the plurality of pixels while the transmittance is controlled by the chromic mirror, wherein the output signal is read out from the first pixel and the second pixel sequentially or alternately by use of the floating diffusion,
expose the first pixel to the incident light while the chromic mirror in the first pixel is controlled to a transmissive state and the chromic mirror in the second pixel is controlled to a reflective state in the one or more pixel pairs,
store a charge into the first pixel while the chromic mirror in the first pixel and the chromic mirror in the second pixel are controlled to the reflective state after the exposure of the first pixel to the incident light,
expose the second pixel to the incident light by control of the chromic mirror in the second pixel to the transmissive state upon the read out of the charge stored in the first pixel as the output signal,
store a charge into the second pixel while the chromic mirror in the first pixel and the chromic mirror in the second pixel are controlled to the reflective state after the exposure of the second pixel to the incident light, and
expose the first pixel to the incident light by control of the chromic mirror in the first pixel to the transmissive state upon the read out of the charge stored in the second pixel as the output signal.

* * * * *